(12) United States Patent
Ichihara et al.

(10) Patent No.: US 8,129,792 B2
(45) Date of Patent: Mar. 6, 2012

(54) SEMICONDUCTOR DEVICE AND METHOD FOR MANUFACTURING THE SAME

(75) Inventors: Reika Ichihara, Yokohama (JP);
Yoshinori Tsuchiya, Yokohama (JP);
Hiroki Tanaka, Yokohama (JP);
Masahiko Yoshiki, Yokohama (JP);
Masato Koyama, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 503 days.

(21) Appl. No.: 12/233,055

(22) Filed: Sep. 18, 2008

(65) Prior Publication Data

US 2009/0166749 A1   Jul. 2, 2009

(30) Foreign Application Priority Data

Dec. 28, 2007   (JP) ................... 2007-339944

(51) Int. Cl.
*H01L 27/092* (2006.01)
*H01L 21/8238* (2006.01)

(52) U.S. Cl. ......... 257/369; 257/E21.639; 257/E27.062; 438/216

(58) Field of Classification Search .................. 257/369, 257/E21.639, E27.062
See application file for complete search history.

(56) References Cited

U.S. PATENT DOCUMENTS

| | | | |
|---|---|---|---|
| 7,883,967 B2 * | 2/2011 | Mitani et al. .................. | 438/264 |
| 8,013,368 B2 * | 9/2011 | Bohr ............................ | 257/288 |
| 2005/0205940 A1 * | 9/2005 | Ootsuka ........................ | 257/374 |
| 2006/0081939 A1 * | 4/2006 | Akasaka et al. ............... | 257/371 |
| 2007/0007602 A1 * | 1/2007 | Oda et al. ..................... | 257/369 |
| 2007/0249106 A1 * | 10/2007 | Koyama et al. ................ | 438/154 |
| 2008/0135952 A1 * | 6/2008 | Brask et al. ................... | 257/410 |
| 2009/0020825 A1 * | 1/2009 | Doczy et al. .................. | 257/369 |
| 2009/0085126 A1 * | 4/2009 | Yu et al. ....................... | 257/377 |
| 2010/0221878 A1 * | 9/2010 | Yu et al. ....................... | 438/216 |

FOREIGN PATENT DOCUMENTS

JP   2007-173412   7/2007

OTHER PUBLICATIONS

U.S. Appl. No. 12/491,728, filed Jun. 25, 2009, Ichihara, et al.

* cited by examiner

*Primary Examiner* — Jerome Jackson, Jr.
*Assistant Examiner* — David Spalla
(74) *Attorney, Agent, or Firm* — Oblon, Spivak, McClelland, Maier & Neustadt, L.L.P.

(57) ABSTRACT

A semiconductor device includes n- and p-type semiconductor regions separately formed on a substrate, an interlayer insulator formed on the substrate and having first and second trenches formed to reach the n- and p-type regions. There are further included first and second gate insulators formed inside of the first and second trenches, a first metal layer formed inside of the first trench via the first gate insulator, a second metal layer formed in a thickness of 1 monolayer or more and 1.5 nm or less inside of the second trench via the second gate insulator, a third metal layer formed on the second metal layer and containing at least one of a simple substance, a nitride, a carbide and an oxide of at least one metal element of alkaline earth metal elements and group III elements, first and second source/drain regions formed on the n- and p-type regions.

15 Claims, 17 Drawing Sheets

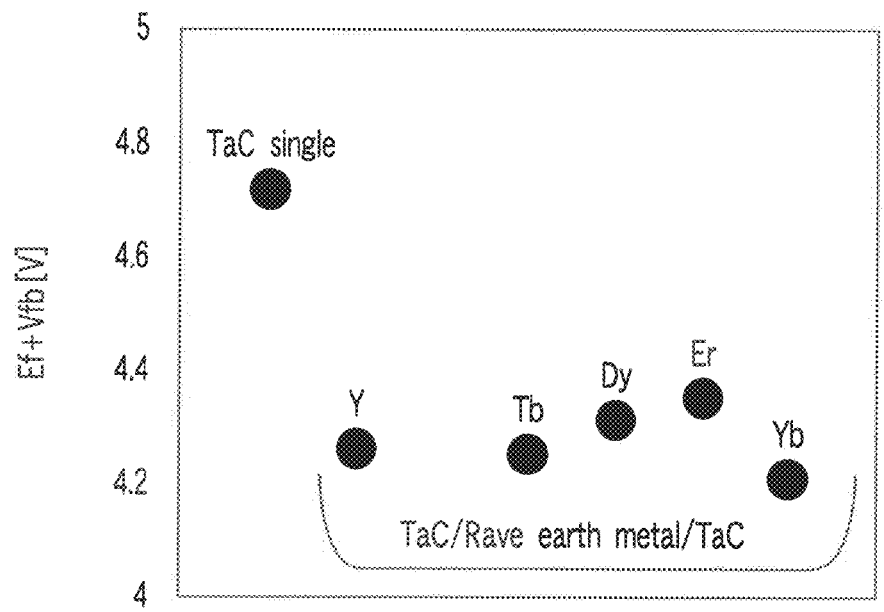
F I G. 5
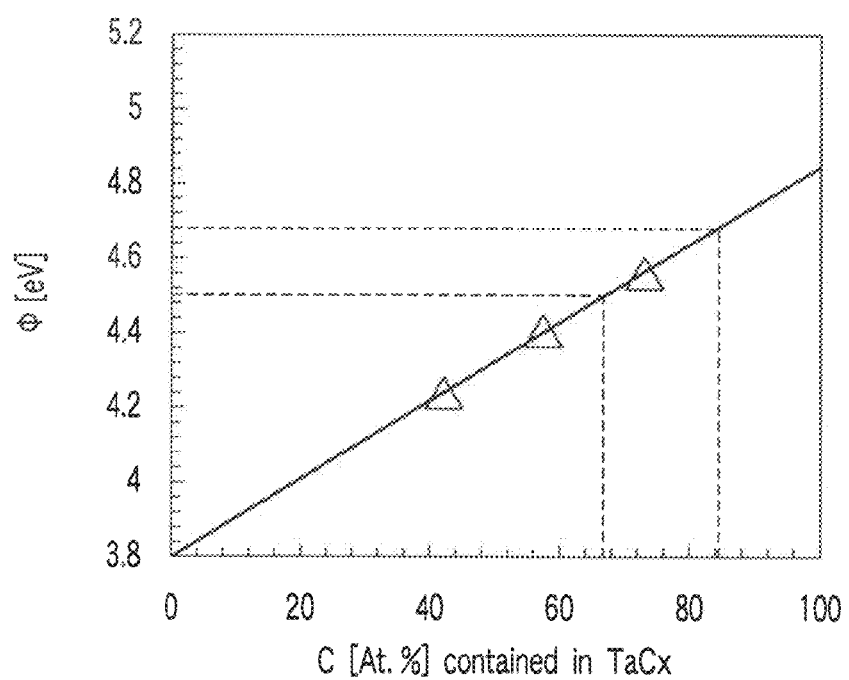
F I G. 6

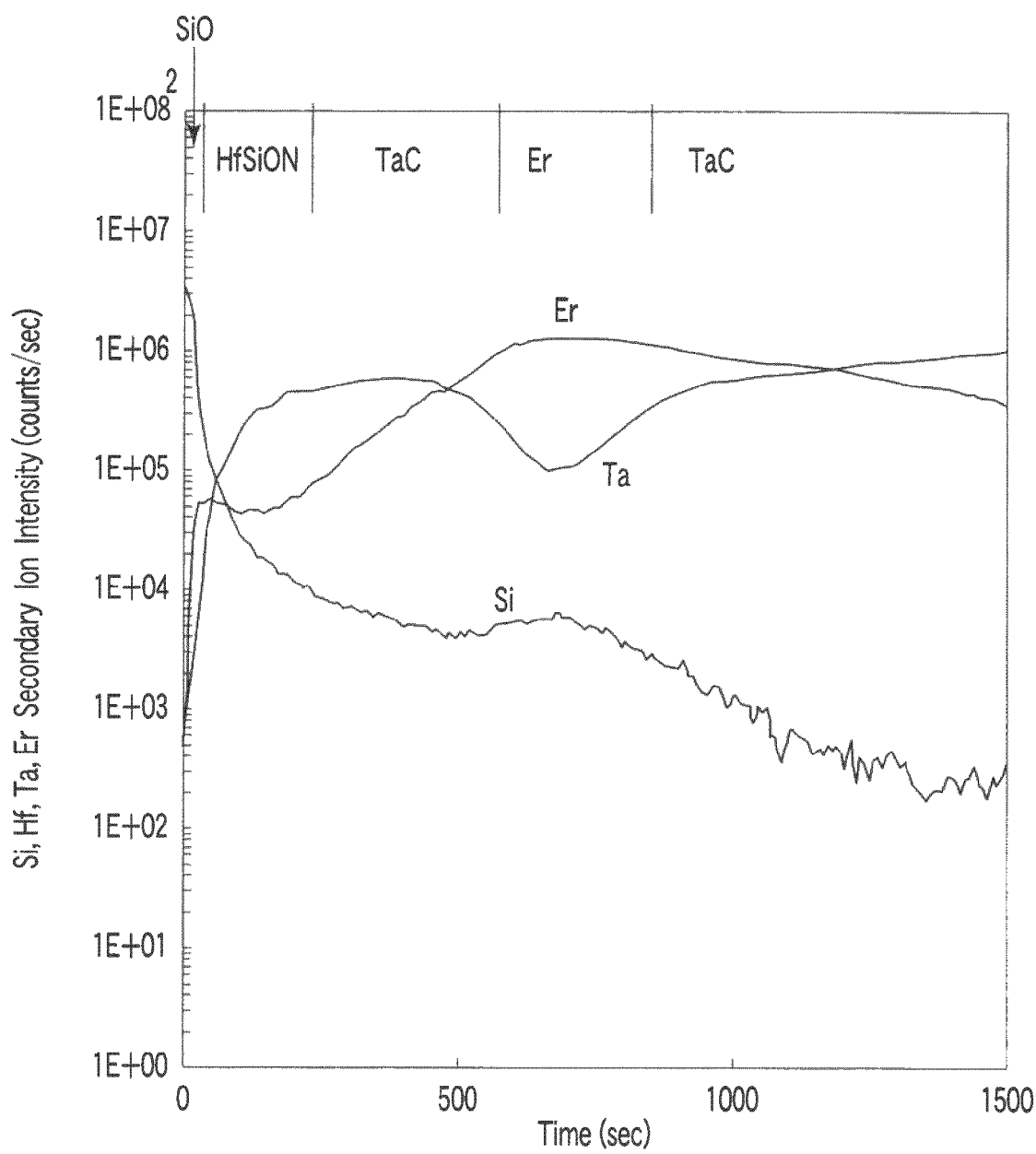
F I G. 23

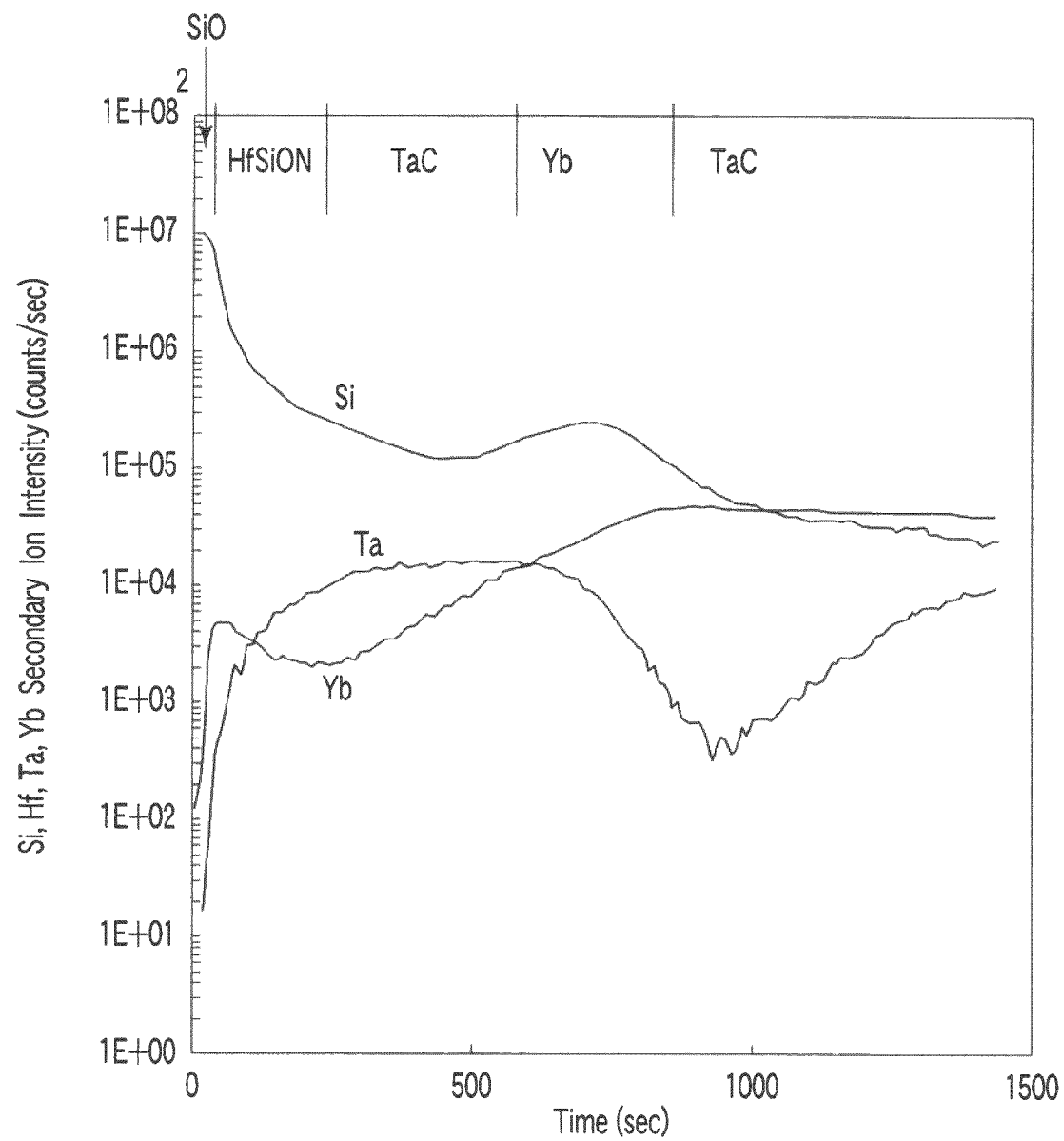
F I G. 24

| TOA=15° | | | | | | |
|---|---|---|---|---|---|---|
| 1000+FGA | N | O | Si | Yb | Hf | Ta |
| at.% | 5.6 | 40.1 | 23.0 | 0.1 | 6.1 | 2.3 |

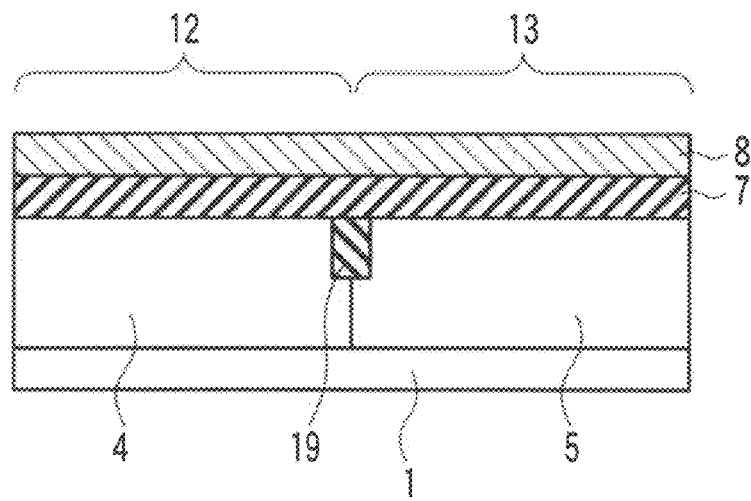
F I G. 27
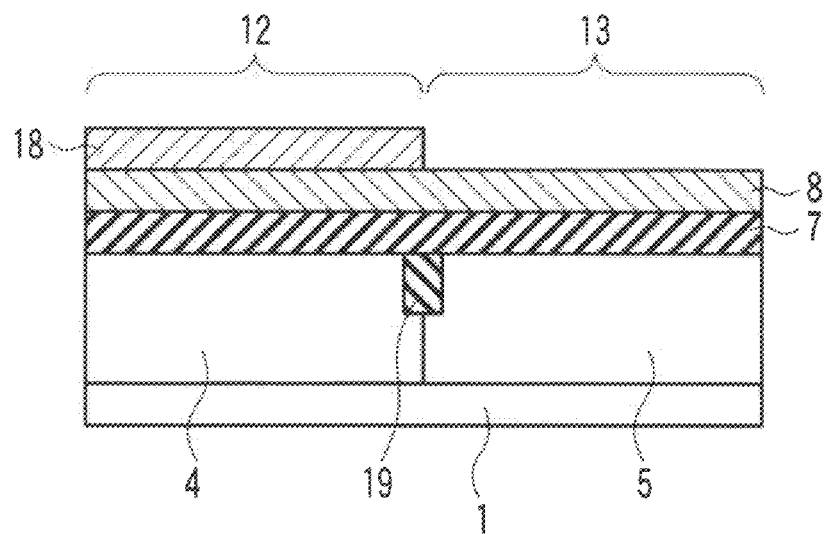
F I G. 28

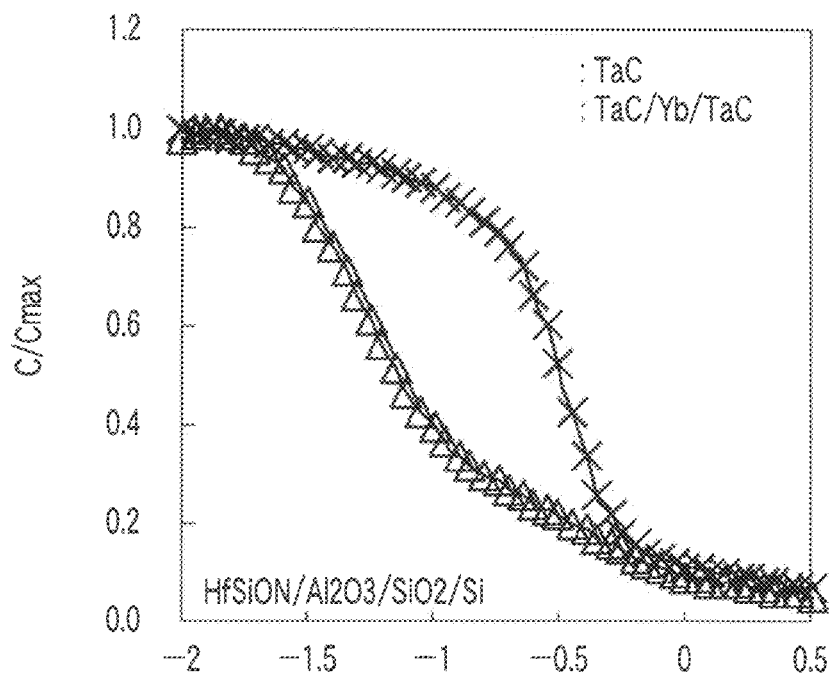
F I G. 31
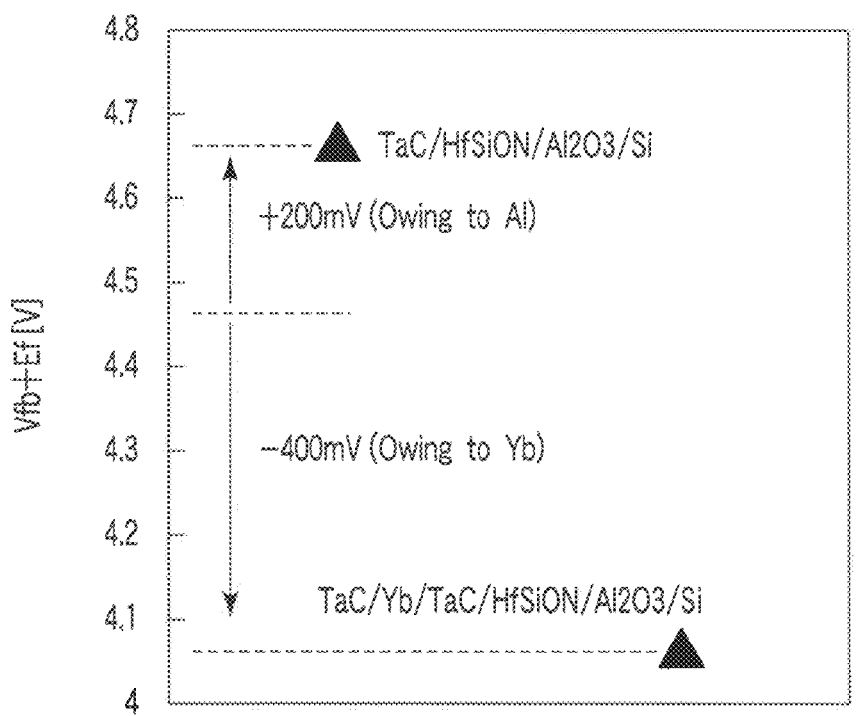
F I G. 32

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2007-339944, filed Dec. 28, 2007, the entire contents of which are incorporated herein by reference.

BACKGROUND OF THE INVENTION

1. Field of the Invention

The present invention relates to a semiconductor device which uses a metal gate electrode, and a method for manufacturing the same.

2. Description of the Related Art

To satisfy a desire for effectively thinning a gate insulating film in accordance with heightened performance and a heightened integration degree of a semiconductor device, it is essential to introduce technologies of a metal gate electrode and a high dielectric constant (high-k) gate insulating film in the future. To obtain adequate performance of an MIS transistor which uses a metal gate/high-k gate insulating film, an effective work function $\phi$eff of a metal gate material needs to be about 3.9 to 4.3 eV for an n-channel type MIS transistor and about 4.8 to 5.2 eV for a p-channel type MIS transistor (e.g., see JP-A 2007-173412 (KOKAI)).

However, a metal having a low work function suitable for the n-channel type MIS transistor is generally not stable in a heating step indispensable for a transistor formation process, and especially, the $\phi$eff of the metal on the high-k gate insulating film becomes a value close to a mid-gap (in the vicinity of 4.6 eV) after the formation of the transistor. Hence, it is difficult to realize a $\phi$eff value of about 3.9 to 4.3 eV suitable for the n-channel type MIS transistor. Therefore, a threshold voltage of the n-channel type MIS transistor cannot sufficiently be lowered. This leads to a serious problem in introducing the technologies of the metal gate electrode/high-k gate insulating film.

As understood for the above, in a case where the high-k gate insulating film/metal gate electrode is used, there occurs a problem that a low threshold voltage cannot be realized in the n-channel type MIS transistor. Therefore, there has been desired the realization of a semiconductor device of the n-channel type MIS transistor that has a reduced threshold voltage, and a manufacturing method which can form the device by using an easy process.

BRIEF SUMMARY OF THE INVENTION

According to a first aspect of the invention, there is provided a semiconductor device comprising:
a semiconductor substrate;
an n-type semiconductor region and a p-type semiconductor region formed to be separated from each other on the semiconductor substrate;
an interlayer insulating film formed on the semiconductor substrate and having a first trench and a second trench formed to reach the n-type semiconductor region and the p-type semiconductor region, respectively;
a first gate insulating film formed along first side walls and a first bottom of the first trench;
a second gate insulating film formed along second side walls and a second bottom of the second trench;
a first metal layer formed along the first side walls and the first bottom of the first trench via the first gate insulating film;
a second metal layer formed in a thickness of 1 monolayer or more and 1.5 nm or less along the second side walls and the second bottom of the second trench via the second gate insulating film;
a third metal layer formed on the second metal layer and containing at least one selected from the group consisting of a simple substance, a nitride, a carbide and an oxide of at least one metal element selected from the group consisting of alkaline earth metal elements and group III elements;
first source/drain regions formed on the n-type semiconductor region to be opposed to each other with a portion of the first gate insulating film formed on the first bottom interposed therebetween; and
second source/drain regions formed on the p-type semiconductor region to be opposed to each other with a portion of the second gate insulating film formed on the second bottom interposed therebetween.

According to a second aspect of the invention, there is provided a method for manufacturing a semiconductor device comprising:
forming an n-type semiconductor region and a p-type semiconductor region on a semiconductor substrate to be separated from each other;
forming a first dummy gate on the n-type semiconductor region and forming a second dummy gate on the p-type semiconductor region, forming first source/drain regions on the n-type semiconductor regions on opposite sides of the first dummy gate,
forming second source/drain regions on the p-type semiconductor regions on opposite sides of the second dummy gate,
forming insulating layers along the opposite sides of the first dummy gates and the second dummy gates, and on the n-type semiconductor region and the p-type semiconductor region,
removing the first dummy gate and the second dummy gate to form a first trench and a second trench in the insulating layer,
forming a first gate insulating film and a second gate insulating film on at least bottoms of the first trench and the second trench, respectively,
forming a first metal layer on the first gate insulating film and a second metal layer on the second gate insulating film, respectively, in a thickness of 1 monolayer or more and 1.5 nm or less, and
forming a third metal layer containing at least one selected from the group consisting of a simple substance, a nitride, a carbide and an oxide of at least one metal element selected from the group consisting of alkaline earth metal elements and group III elements on the second metal layer on the p-type semiconductor region, while the first metal layer on the n-type semiconductor region is masked.

BRIEF DESCRIPTION OF THE SEVERAL VIEWS OF THE DRAWING

FIG. 5 is a graph of comparison between Vfb of an MIS capacitor on which the forming gas annealing at 450° C. is conducted after the formation of a TaCx/HfSiON/Si structure and Vfb of an MIS capacitor on which the forming gas annealing at 450° C. for 30 minutes is conducted after the formation of a TaCx/rare earth metal-containing layer/TaCx/HfSiON/Si structure in a condition where Fermi energy Ef of an Si substrate used is added to each Vfb;

FIG. 6 is a graph showing a relation between a work function and a composition of TaCx;

FIG. 23 is a graph showing profiles of Er, Ta, and Si found by back-side SIMS analysis of an MIS capacitor on which the annealing at 1000° C. and then the forming gas annealing at 450° C. for 30 minutes are conducted after the formation of a TaCx/Er/TaCx/HfSiON/Si structure;

FIG. 24 shows profiles of Yb, Ta, and Si similar to FIG. 23;

FIGS. 27 to 29 are cross-sectional views for stepwise explaining CMOS semiconductor device manufacturing steps according to the second embodiment;

FIG. 31 shows CV characteristics of an MIS capacitor on which the annealing at 1000° C. and then the forming gas annealing at 450° C. for 30 minutes are conducted after the formation of a TaCx/HfSiON/$Al_2O_3$/$SiO_2$/Si structure and a TaCx/Yb/TaCx/HfSiON/$Al_2O_3$/$SiO_2$/Si structure; and FIG. 32 is a diagram for explaining effects of Al and Yb to (Vfb+Ef) of the MIS capacitor of FIG. 31.

DETAILED DESCRIPTION OF THE INVENTION

According to embodiments of the present invention which will be described below, in a semiconductor device including n-channel type MIS transistors using a metal gate electrode, the n-channel type MIS transistors having a low threshold voltage are realized, and a manufacturing method is provided that can manufacture this semiconductor device in an easy process.

Hereinafter, embodiments of the present invention will be described with reference to the drawings.

First Embodiment

Figure 1:
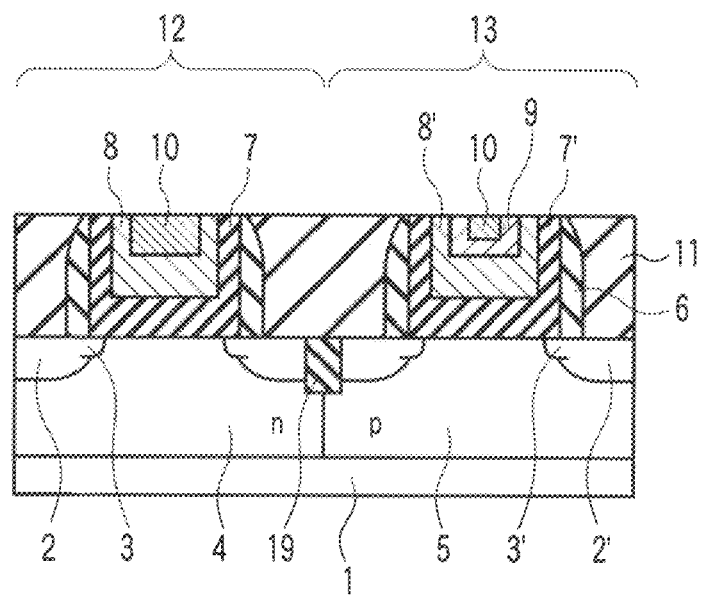
FIG. 1 is a cross-sectional view of a CMOS semiconductor device according to a first embodiment.

FIG. 1 is a cross-sectional view of a CMOS semiconductor device according to the first embodiment of the present invention. In the surface of an Si substrate 1, an n-type semiconductor region 4 and a p-type semiconductor region 5 are formed, and on these regions, a p-channel type MISFET 12 and an n-channel type MISFET 13 are formed respectively. The n-type and p-type semiconductor regions 4 and 5 are formed as so-called wells.

On the surfaces of the n-type and p-type semiconductor regions 4 and 5, a high dielectric constant (high-k) gate insulating films 7 and 7' made of, for example, HfSiON are formed, respectively. On the gate insulating film 7 on the n-type semiconductor region and on the gate insulating film 7' on the p-type semiconductor region, a gate electrode 8 made of TaCx and a gate electrode 8' mainly made of TaCx are formed as thick as 1 monolayer or more and 1.5 nm or less, respectively. The gate electrode 8' and the gate insulating film 7' may contain an alkaline earth metal element or an element in the group III (e.g., Sc, Y, lanthanoids or actinoids).

In the present embodiment, a gate electrode layer formed in contact with the gate insulating film will be referred to as "the under-layer gate electrode". Furthermore, the reason why the expressions of the gate insulating films 7 and 7' as well as the gate electrodes 8 and 8' are employed herein is that some difference might occur between the gate insulating films on the n-type and p-type semiconductor regions and between the under-layer gate electrodes on the n-type and p-type semiconductor regions as a result in the subsequent steps. It is not intended to require steps for independently forming the gate insulating films and the under-layer gate electrodes on the n-type and p-type semiconductor regions to make the above difference.

On the gate electrode 8', there is formed a layer 9 that contains a simple substance, a nitride, a carbide, or an oxide of at least one metal element of alkaline earth metal elements and elements in the group III of the periodic table (hereinafter referred to as "group III elements") (e.g., Sc, Y, lanthanoids and actinoids). During transistor forming steps, some of the alkaline earth metal elements, Sc, Y, and the elements of lanthanoids and actinoids might be diffused from the layer 9 containing the above metal elements into the under-layer gate electrode 8' and the gate insulating film 7' on the p-type semiconductor region 5. However, to obtain effects of the present embodiment, it is not always required that some of the alkaline earth metal elements, Sc, Y, and the elements of lanthanoids and actinoids are diffused into the under-layer gate electrode 8' and the gate insulating film 7' on the p-type semiconductor region 5.

On the gate electrode 8 on the n-type semiconductor region 4 and on the layer 9 on the p-type semiconductor region, there is further formed a layer 10 of a high-melting point metal such as TiNx, TaCx or W, polysilicon, or a stack thereof. It is to be noted that reference number 6 is a side wall insulating film, reference number 11 is an inter-layer insulating film, and reference number 19 is a device isolation region formed by shallow trench isolation (STI). As understood from the above, the semiconductor device of the first embodiment has a structure unique to a device formed by a so-called gate replacement process.

Figure 2:
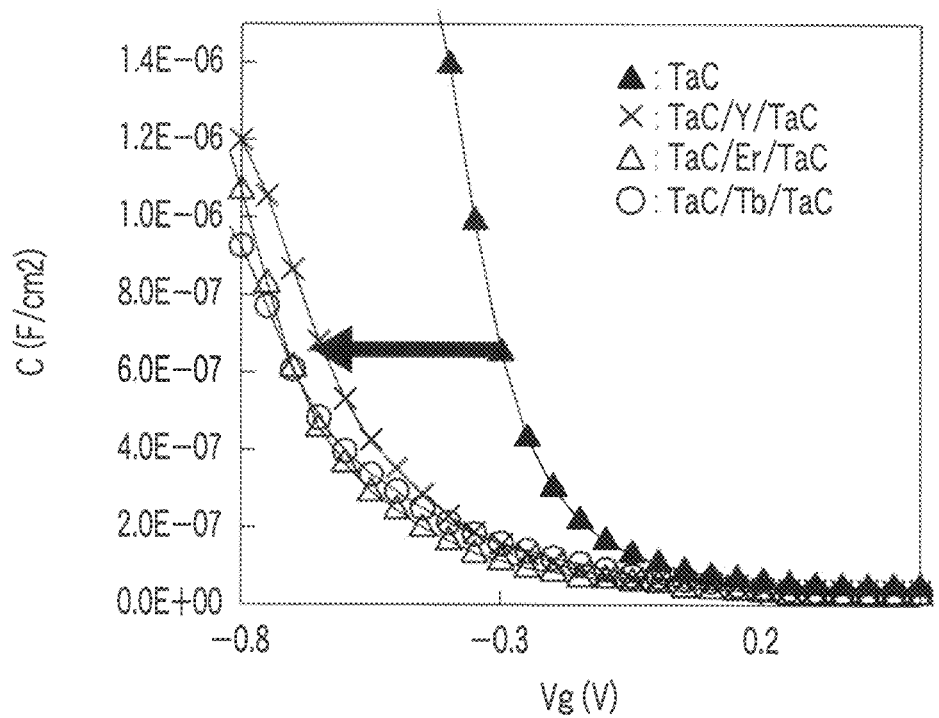
FIG. 2 is a graph of comparison between CV characteristics of an MIS capacitor on which forming gas annealing at 450° C. is conducted after the formation of a TaCx/HfSiON/Si structure and CV characteristics of an MIS capacitor on which the forming gas annealing at 450° C. is conducted after the formation of a TaCx/Y, Er or Tb/TaCx/HfSiON/Si structure.

FIG. 2 is a graph of comparison between CV characteristics of an MIS capacitor formed by conducting forming gas annealing at 450° C. after the formation of a TaCx/HfSiON/Si structure and CV characteristics of an MIS capacitor formed by conducting the forming gas annealing at 450° C. after the formation of a TaCx/Y, Er, or Tb/TaCx/HfSiON/Si structure. In a case where a layer of Y, Er, or Tb is formed in the gate electrode, a CV-curve of the MIS capacitor shifts by about 400 mV in a negative direction as compared with a case where it is made of a single layer of TaCx. That is, its flat-band voltage Vfb is changed by about −400 mV.

Figure 3:
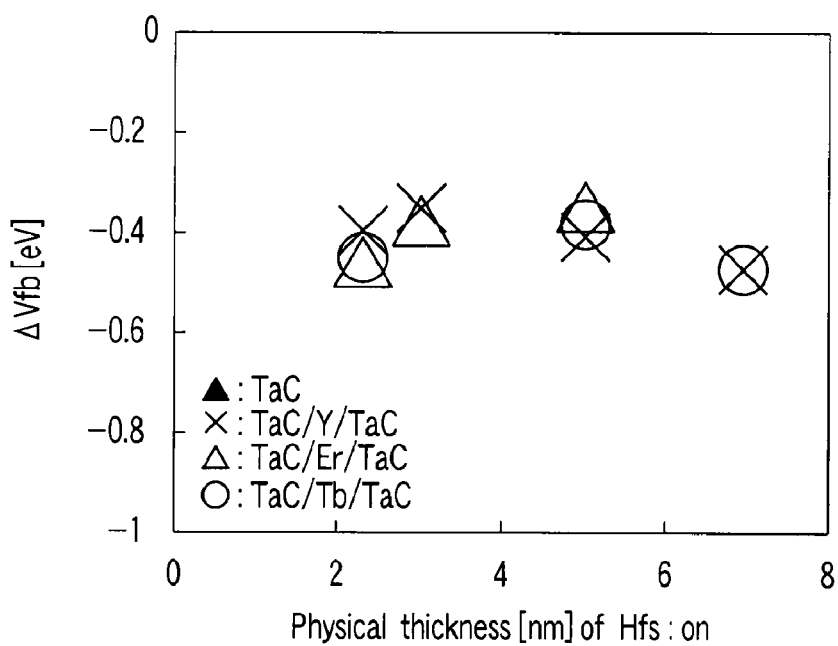
FIG. 3 is a graph showing an HfSiON film thickness dependency of a Vb shift amount obtained by formation of a rare earth metal layer in a case where the forming gas annealing at 450° C. for 30 minutes is conducted.

FIG. 3 is a graph showing an HfSiON film thickness dependency of a Vfb shift amount obtained by stacking Er, Y, or Yb. The Vfb shift amount is obtained by the following equation:

$$\Delta Vfb = (Vfb(TaCx/Y,Er \text{ or } Tb/TaCx/HfSiON/Si)) - (Vfb(TaCx/HfSiON/Si))$$

FIG. 3 shows that a Vfb change of about −400 mV is obtained by the stack of Y, Er or Tb, irrespective of the thickness of an HfSiON film, and a work function φeff of the gate electrode is changed by about 400 mV in a negative direction owing to a rare earth element such as Y, Er, or Tb having a low work function of 3.0 to 3.5 eV. To obtain such a φeff change, the rare earth element needs to be present at a location in the gate electrode that is somewhat near an interface between the gate insulating film and the gate electrode.

Figure 4:
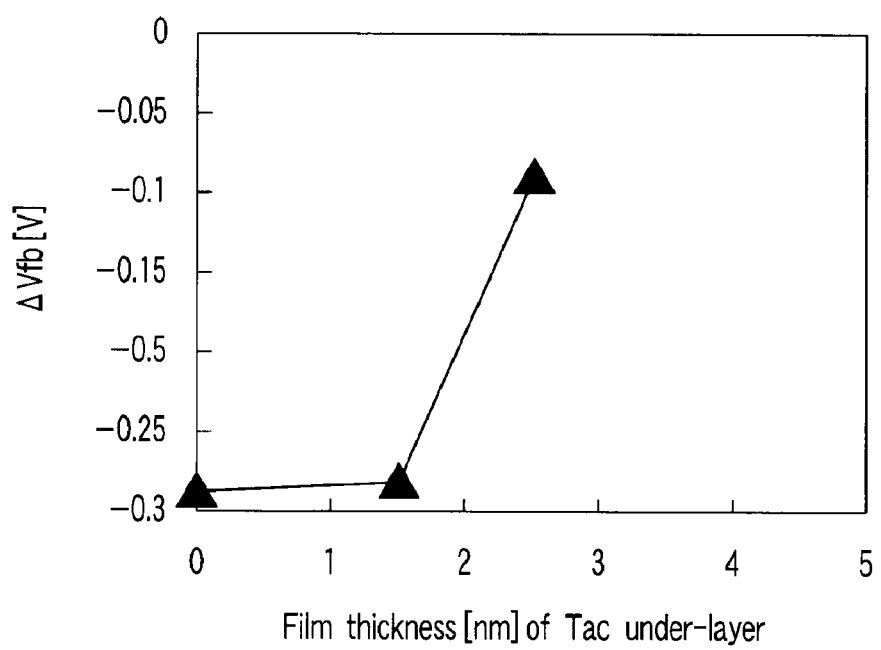
FIG. 4 is a graph showing an under-layer TaCx film thickness dependency of ΔVfb by Er stack in a case where the forming gas annealing at 450° C. for 30 minutes is conducted.

FIG. 4 is a graph depicted by plotting amounts of the Vfb change due to the Er stack to a film thickness of a TaCx layer formed as the under-layer gate electrode. In the under-layer gate TaCx layer, the amounts of the φeff change rapidly increase in a range of 1.5 nm or less in thickness thereof. Hence, it is understood that when the rare earth element is present in the gate electrode within 1.5 nm from the interface between the gate insulating film and the gate electrode, a sufficient φeff lowering effect can be obtained. That is, when the layer containing the rare earth element is formed on the TaCx layer having a thickness of 1.5 nm or less, the effect of the present embodiment can be obtained.

Methods to obtain the above effect include not only a method of forming a layer of the rare earth element on the thin under-layer TaCx, as in the present embodiment, but also a method of forming a metal layer containing the rare earth element directly on the surface of the gate insulating film. However, a rare earth element-containing layer having a threshold voltage lowering effect of the n-channel type MISFET must not exist in the p-channel type MISFET, so that there is required a step to peel off the rare earth element-containing layer on the p-channel type MISFET region. The peel-off step of the gate insulating film surface might cause the deterioration of the gate insulating film, and hence there is a risk that this will greatly affect the electrical characteristics.

In contrast, in the process to peel off the rare earth element-containing layer on the under-layer metal gate, the gate insulating film is not touched, so that the electrical characteristics are scarcely affected, which decreases the difficulty of the process. In the light of this respect, the semiconductor device of the present embodiment has the desired structure.

Furthermore, to obtain this process merit, the under-layer gate electrode only needs to be present on the gate insulating film as a continuous film, and hence it is necessary for the thickness of the under-layer gate electrode to be 1 monolayer or more. This embodiment has been described using TaCx as the material of the under-layer gate electrodes 8 and 8', but another metal gate material can be used to obtain the same effects. However, to obtain a process merit of not subjecting the gate insulating films 7 and 7' to the peel-off step, it is required for the under-layer gate electrodes 8 and 8' to be resistant to a wet peel-off step. TaCx is one of the materials having the lowest solubility among the metals. From this viewpoint, TaCx is preferable as the material for the under-layer gate electrode.

As described above, the layer 9 that contains at least one of a simple substance, a nitride, a carbide, and an oxide of at least one metal element of alkaline earth metal elements and group III elements (Sc, Y, lanthanoids and actinoids) may contain a nonmetallic element such as, for example, Si, C, N, or O in addition to those metal elements. However, in a case where a layer containing the metal element and Si is used as the material of the layer 9 and TaCx is used as the material of the under-layer gate electrode, the bonding energy of the metal element and C is larger than that of the metal element and Si. In consequence, the metal element bonding with Si in the layer 9 may additionally bond with an excessive C atom in TaCx which is the under-layer gate electrode material, whereby the Si layer might separate inconveniently. The Si layer is a semiconductor, and so increases the resistance of the gate electrode. Therefore, if the under-layer gate electrode is made of TaCx, it is desirable for the layer 9 to not contain Si.

It is to be noted that since the bonding energy of the metal element and N or O is larger than that of the metal element and C, even if the layer 9 contains N or O, the bond of the metal element in the layer 9 and N or O is not replaced by the bond with excessive C in the under-layer TaCx. Furthermore, the bonding energy of C and the rare earth metal is larger than that of Si, and hence C forms a stable metal compound.

This effect is not limited to elements such as Y, Er and Tb, but it is only required that the layer containing Sc, Y, a lanthanoid, an actinoid or alkaline earth metal element is formed on the under-layer gate TaCx layer. FIG. 5 shows Vfb of the gate electrode in a case where the forming gas annealing at 450° C. is conducted after the formation of a TaCx/HfSiON/Si structure and a TaCx/rare earth metal/TaCx/HfSiON/Si structure. Ef is the Fermi energy of the Si substrate employed. It can be understood that a Vfb lowering effect is obtained even by use of rare earth elements other than Y, Er, and Tb.

The reason for the following requirement will be described later, but as far as the structure shown in the present embodiment is concerned, that is, in the case of reducing the threshold value of the n-channel type MIS transistor by utilizing the Vfb lowering effect due to the decrease in the work function φeff of the gate electrode, a gate stack structure must not be exposed to a high temperature environment of about 1000° C. as in a gate-first process (a process of first forming the gate). Therefore, the present embodiment must be formed by a replacement gate process, and as a result, it has a structure peculiar to the replacement gate process as shown in FIG. 1.

Furthermore, since the present invention gives a Vfb change effect of about –400 mV, it is possible to realize a low φeff suitable for the n-channel type MIS transistor, if the work function of TaCx in the under-layer gate is 4.7 eV or less.

FIG. 6 is a graph showing a relation between the composition and the work function of TaCx, but to have a work function of 4.7 eV or less, it is desirable for the atomic density of TaCx to be 85 atomic % or less.

Figure 7:
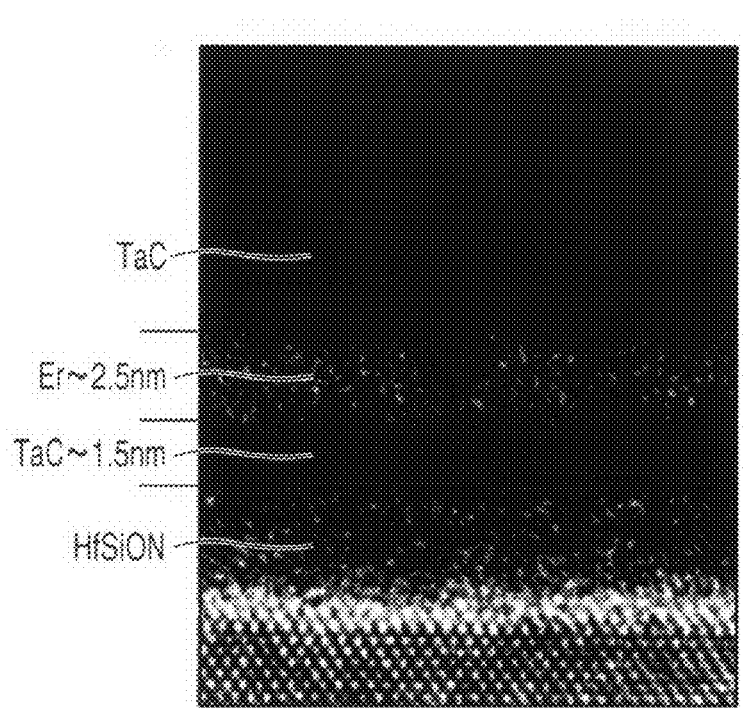
FIG. 7 is a cross-sectional TEM image of an MIS capacitor on which the forming gas annealing at 450° C. for 30 minutes is conducted after the formation of a TaCx/Er/TaCx/HfSiON/Si structure.

FIG. 7 shows a cross-sectional TEM image of a sample by which the effect according to the present invention has actually been obtained and on which the forming gas annealing at 450° C. is conducted after the formation of a TaCx/Er/TaCx/HfSiON structure. It has been confirmed by an electron energy loss spectroscopy (EELS) spectrum or an energy dispersive x-ray analysis (EDX) analysis that the elements written in FIG. 7 are present at their respective positions.

Figure 8:
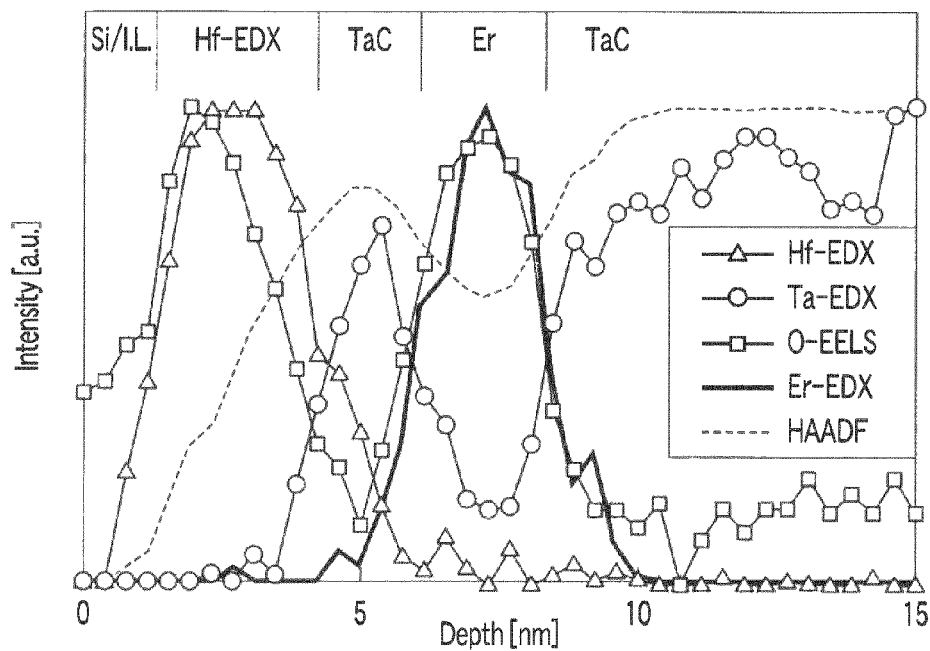
FIG. 8 is a graph showing a depth-directional distribution of each element found from EELS and EDX and an HAADF strength distribution of the MIS capacitor on which the forming gas annealing at 450° C. for 30 minutes is conducted after the formation of the TaCx/Er/TaCx/HfSiON/Si structure.

FIG. 8 shows the depth-directional profiles of Hf, Ta, O, and Er confirmed by EELS or EDX. The strength of a high-angle annular dark field (HAADF) additionally shown in FIG. 8 is proportional to the square of an atomic number, and it corresponds to a contrast in the TEM image shown in FIG. 7. By comparison between the HAADF strength and the profile of each element, there is confirmed correspondences between the elements written in the TEM image of FIG. 7 and their positions.

Figure 9:
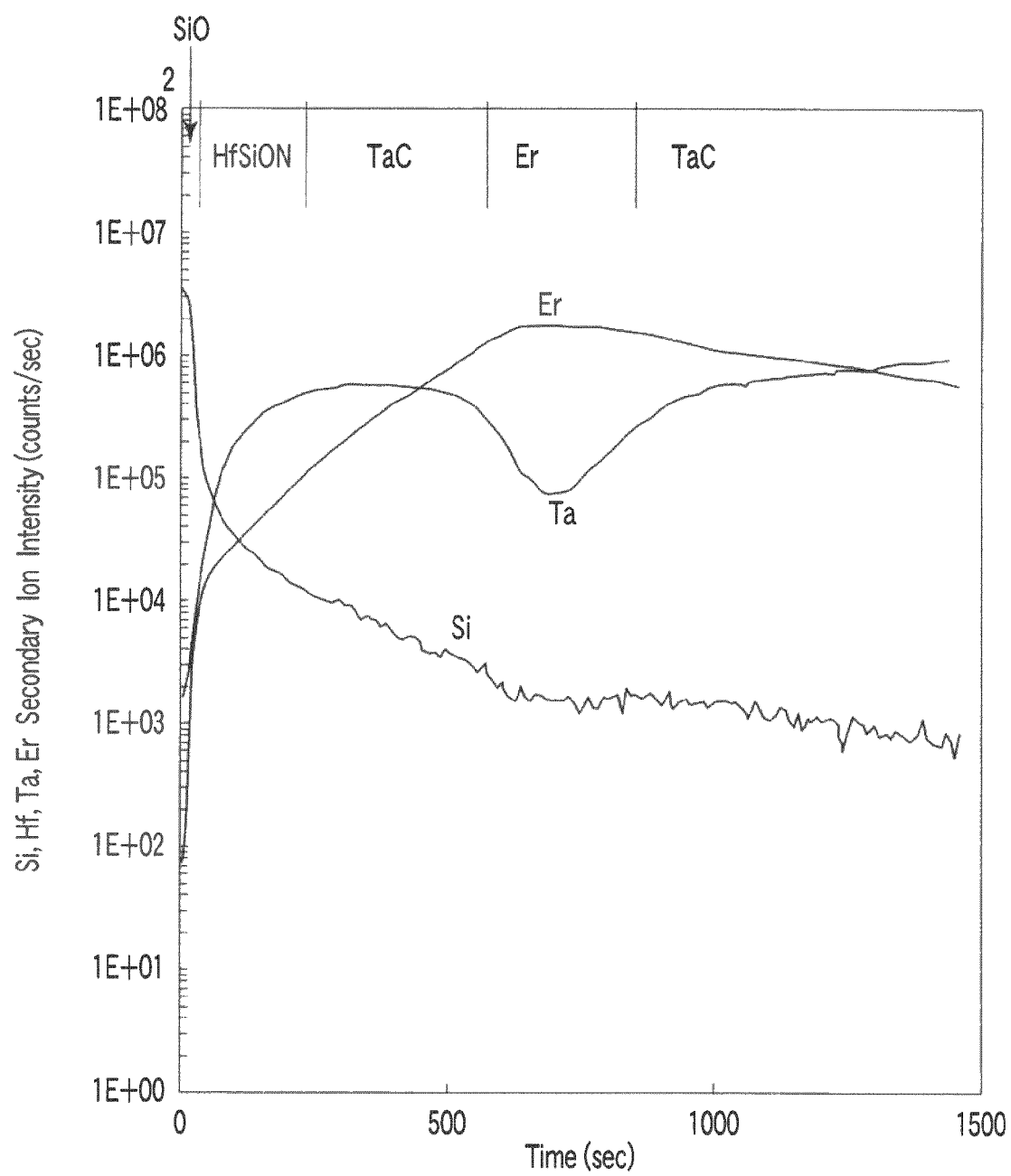
FIG. 9 is a graph showing profiles of Er, Ta and Si found by back-side SIMS analysis of an MIS capacitor on which the forming gas annealing at 450° C. for 30 minutes is conducted after the formation of the TaCx/Er/TaCx/HfSiON/Si structure.

Minute quantities of elements, which cannot be measured by EELS, can be detected by SIMS analysis. FIG. 9 shows the results obtained by measuring, by SIMS analysis, an Er profile in a sample by which the effect according to the present invention has actually been obtained and on which the forming gas annealing at 450° C. is conducted after the formation of a TaCx/Er/TaCx/HfSiON structure.

Here, employed is a so-called back-side-SIMS method in which, after the Si substrate is peeled off, analysis is conducted from the side of the $SiO_2$ layer of an HfSiON/Si interface through the $SiO_2$ layer. Er diffuses from an Er layer formed on the under-layer TaCx electrode, so that Er is present also in the under-layer TaCx and HfSiON. Thus, the rare earth elements and alkaline earth elements in the gate stack structure can be detected by the TEM-EELS or the back-side-SIMS method.

Figure 10:
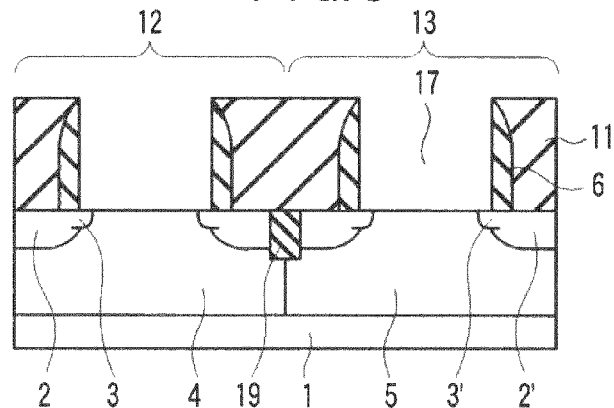
FIGS. 10 to 14 are cross-sectional views for stepwise explaining CMOS semiconductor device manufacturing steps according to the first embodiment.

The semiconductor device manufacturing method of the present embodiment uses the so-called replacement gate process for the manufacture of transistors, and its manufacturing steps are shown in FIGS. 10 to 14. First, as shown in FIG. 10, the n-type well region 4 and the p-type well region 5 separated from each other by the STI-structure device isolation layer 19 are formed on the semiconductor substrate 1. Subsequently, dummy gates (not shown) are formed on the n-type well region 4 and the p-type well region 5, respectively. Then, while the dummy gates are used as masks, a p-type impurity is implanted into the n-type well region 4 to form a p-type extension layer 3, and an n-type impurity is implanted into the p-type well region 5 to form an n-type extension layer 3'.

Afterward, side wall layers 6 are formed on the sides of the above dummy gates, respectively. While the dummy gates and the side wall layers 13 are used as masks, a p-type impurity is implanted into the n-type well region 4 to form a p-type diffusion layer 2, and an n-type impurity is implanted into the p-type well region 5 to form an n-type diffusion layer 2'.

Subsequently, an interlayer insulating film 11 is deposited on the diffusion layers and then flattened. Afterward, the above dummy gates are removed to obtain a structure shown in FIG. 10. As understood from FIG. 10, after the removal of the dummy gates, trenches 17 are formed. It is to be noted that silicide layers may be formed on the diffused layers 2 and 2'.

Figure 11:
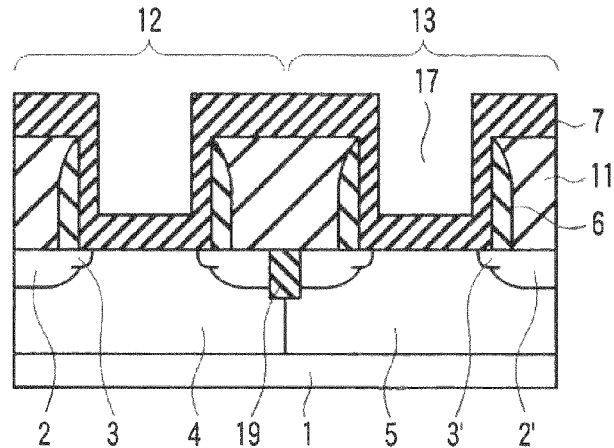
Figure 12:
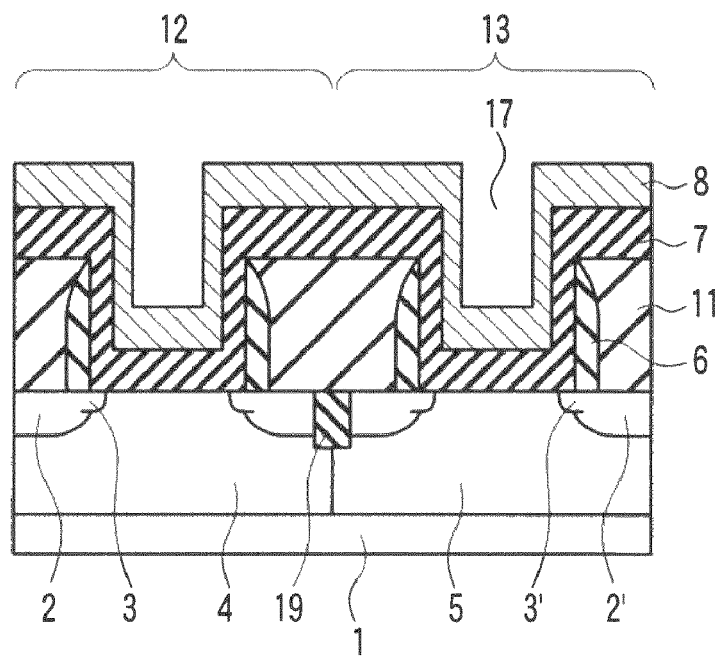

Next, as shown in FIG. 11, a gate insulating layer 7 is formed by, for example, a metal organic chemical vapor deposition (MOCVD) method. Here, as the material for the gate insulating layer 7, HfSiON is used. Next, as shown in FIG. 12, by using a film formation method, for example, a sputtering process or a CVD method, the under-layer gate electrode 8 is formed as thick as 1 monolayer or more and 1.5 nm or less on the gate insulating layer 7. In this embodiment, a TaCx layer is formed in a thickness of 1.5 nm by the sputtering process.

Figure 13:
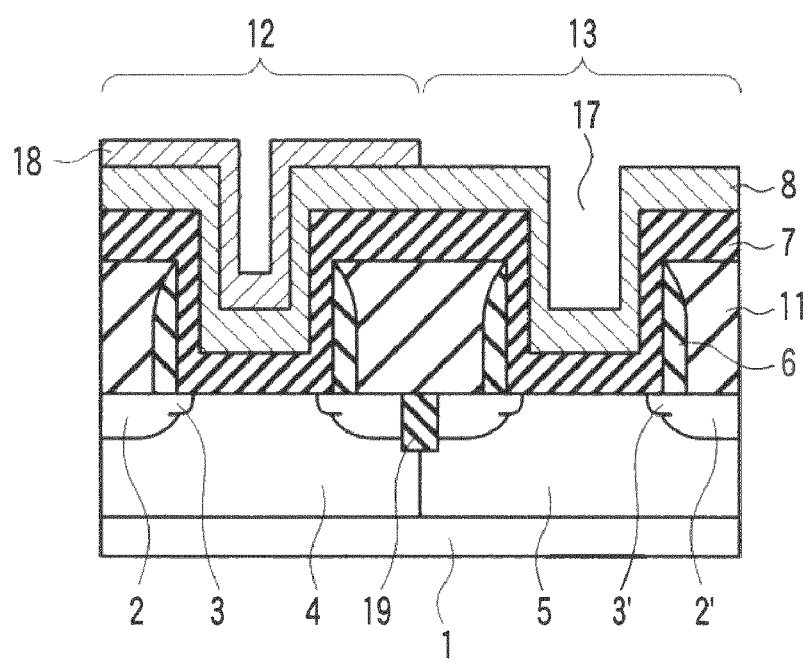
Figure 14:
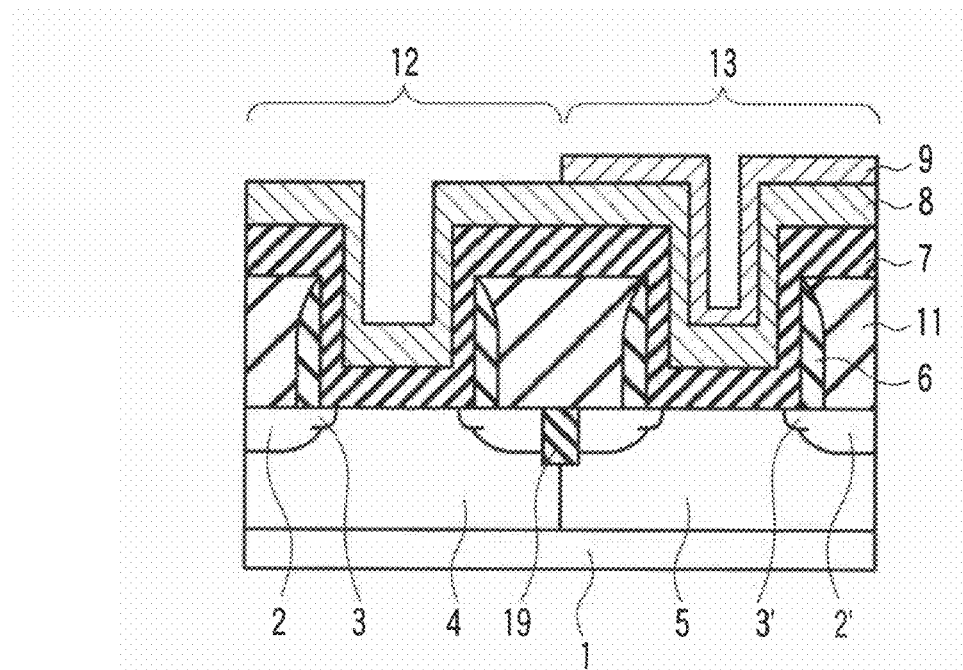

Next, as shown in FIG. 13, a mask material 18 made of silicon oxide is formed on the n-type semiconductor region 4. Then, by using a film formation method such as the sputtering process or the CVD process, on the under-layer gate electrode 8 and the mask 18, the layer 9 is formed which contains at least one of a simple substance, a nitride, a carbide, or an oxide of at least one metal element of alkaline earth metal elements and group III elements (Sc, Y, lanthanoids and actinoids). Then, the layer 9 on the mask material 18 is peeled off together with the mask material 18 by using a liftoff method. In consequence, a structure shown in FIG. 14 is obtained.

Afterward, on the exposed under-layer gate electrode 8 and the exposed layer 9 on the n-type semiconductor region, an upper layer gate electrode 10 made of a high-melting point metal such as TaCx, W or TiNx, a polysilicon electrode, or a stack structure thereof is formed by depositing the material in such a manner as to fill the trenches 17. Here, the TaCx layer is formed by the sputtering process. Afterward, the upper layer electrode 10 is flattened by an ordinary chemical mechanical polishing (CMP) process, thereby obtaining the structure shown in FIG. 1. As described above, there is a possibility that diffused metal from the layer 9 may be contained in the gate insulating film 7 and the under-layer gate electrode 8 on the p-type semiconductor region 5 owing to a heating step in the subsequent transistor formation process.

As understood from the above, according to the first embodiment, the metal layer containing at least one of a simple substance, a nitride, a carbide, or an oxide of at least one metal element of alkaline earth metal elements and group III elements (Sc, Y, lanthanoids and actinoids) is provided on the under-layer gate electrode of the n-channel type MIS transistor, whereby the semiconductor device that includes the n-channel type MIS transistor having a low threshold voltage can be realized by the manufacturing method that has a lower level of processing difficulty.

First Modification

In the first embodiment, description has been made with reference to the case of using the high-concentration impurity diffused layer as the source/drain regions, but, needless to say, a so-called Schottky transistor using source/drain electrodes as the source/drain regions may be employed.

As the metal material of the source/drain electrodes, there is used, for example, a simple substance, a compound, or a stack of Ni silicide, Pt silicide, Co silicide or a rare earth element silicide.

A general formation method includes depositing a metal layer of Ni, Pt, Co or a rare earth element on Si regions that sandwich a gate electrode, and then performing a heat treatment (e.g., at about 300° C. or more to about 600° C. or less) to form the silicide.

It is to be noted that an impurity may be segregated on an interface between the source/drain electrode and the Si region. The segregation of the impurity is carried out by introducing the impurity thereinto before or after the formation of the silicide.

Second Embodiment

Figure 15:
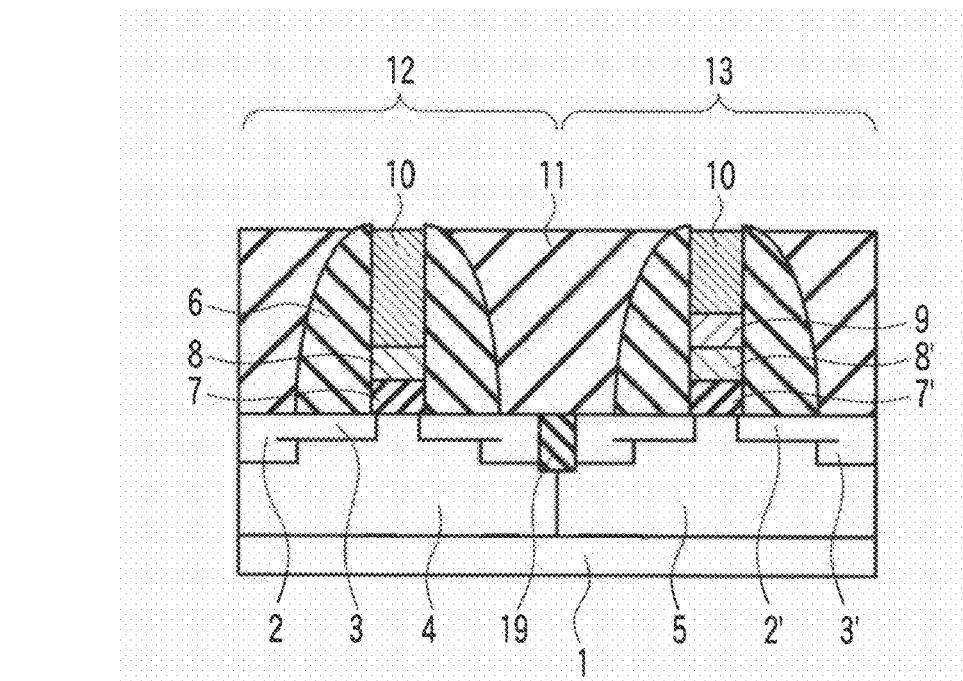
FIG. 15 is a cross-sectional view of a CMOS semiconductor device according to a second embodiment.

FIG. 15 is a cross-sectional view of a semiconductor device according to the second embodiment of the present invention. On the surface region of an Si substrate 1 as a semiconductor substrate, an n-type semiconductor region 4 and a p-type semiconductor region 5 are formed, and on these regions, a p-channel type MISFET 12 and an n-channel type MISFET 13 are formed, respectively. The n-type and p-type semiconductor regions 4 and 5 are formed as so-called wells.

On the surface of the n-type semiconductor region 4, a high-k gate insulating film 7 of, for example, HfSiON is formed, and on the surface of the p-type semiconductor region 5, there is formed a gate insulating film 7' containing a high-k gate insulating film of, for example, HfSiON as a main material and at least one metal element of alkaline earth metal elements, Sc, Y, lanthanoids and actinoids.

Furthermore, the reason why the expressions of the gate insulating films 7 and 7' are employed herein is that a difference naturally occurs between the gate insulating films on the n-type and p-type semiconductor regions as a result in the subsequent steps. It is not intended to require steps for independently forming the gate insulating films on the n-type and p-type semiconductor regions.

On the gate insulating film 7 on the n-type semiconductor region, an under-layer gate electrode 8 of, for example, TaCx is formed, and on the gate insulating film 7' on the p-type region, a gate electrode 8' containing, for example, TaCx as a main material is formed. The reason why the expressions of the gate insulating films 8 and 8' are employed herein is that a difference might occur between the under-layer gate electrode on the n-type semiconductor region and the under-layer gate electrode on the p-type semiconductor region as a result in the subsequent steps. It is not intended to require steps for independently forming the under-layer gate electrodes on the n-type and p-type semiconductor regions.

On the gate electrode 8' on the p-type semiconductor region, there is formed a gate electrode 9 containing at least one metal element of alkaline earth metal elements, Sc, Y, lanthanoids and actinoids. Furthermore, on the gate electrode 8 and the gate electrode 9, an upper layer gate electrode 10 is formed which is made of a high-melting point metal such as TaCx or W, a polysilicon electrode, or a stack structure thereof.

Figure 16:
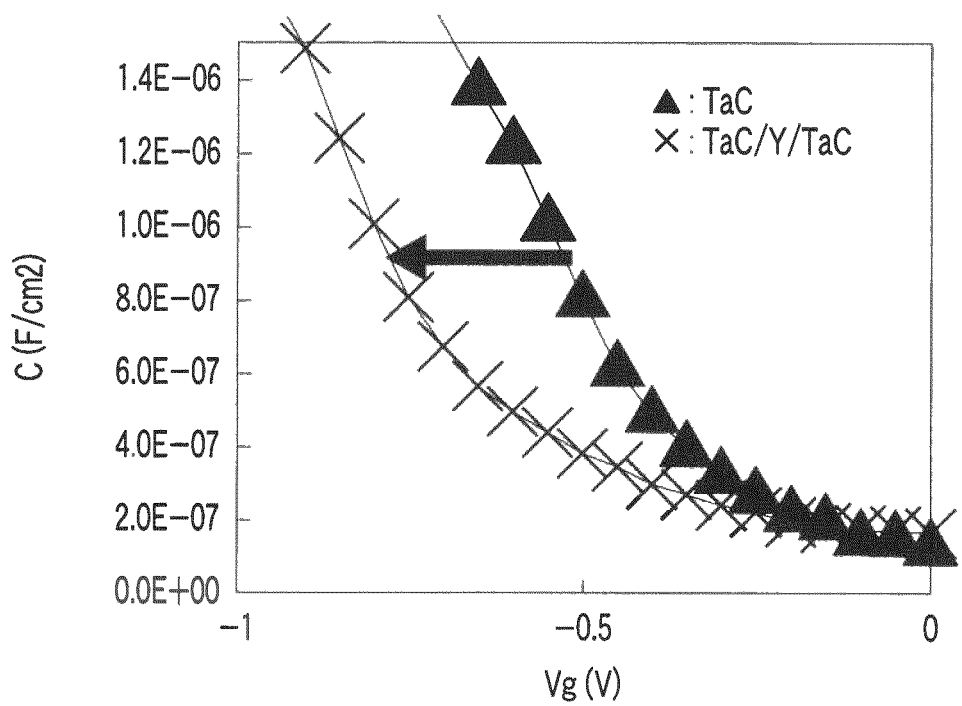
FIG. 16 is a graph of comparison between CV characteristics of an MIS capacitor on which annealing at 1000° C. is conducted after the formation of a TaCx/HfSiON/Si structure and then the forming gas annealing at 450° C. is further conducted and CV characteristics of an MIS capacitor on which the annealing at 1000° C. is conducted after the formation of a TaCx/Y/TaCx/HfSiON/Si structure and then the forming gas annealing at 450° C. is conducted.

FIG. 16 shows comparison between CV characteristics of an MIS capacitor on which annealing at 1000° C. and then forming gas annealing at 450° C. are conducted after the formation of a TaCx/HfSiON/Si structure and CV characteristics of an MIS capacitor on which annealing at 1000° C. and then forming gas annealing at 450° C. are conducted after the formation of a TaCx/Y/TaCx/HfSiON/Si structure. In a case where a layer of Y is sandwiched between the two TaCx layers to form the gate electrode, a CV curve shifts in the negative direction by about 250 mV as compared with a case where the gate electrode is made of a single layer of TaCx. That is, a flat-band voltage Vfb is changed by about −250 mV.

Figure 17:
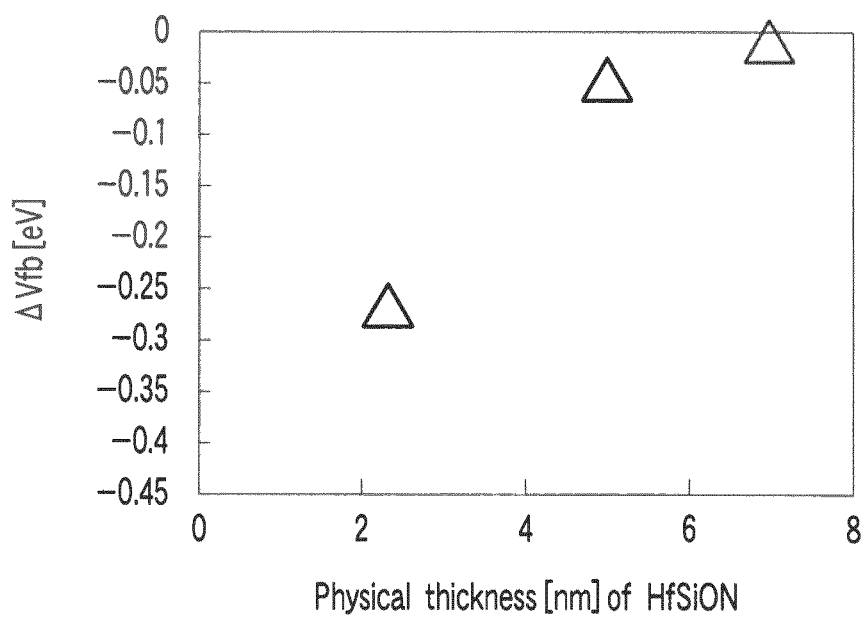
FIG. 17 is a graph showing an HfSiON film thickness dependency of a Vfb shift amount obtained by the formation of an Er layer in a case where the annealing at 1000° C. and then the forming gas annealing at 450° C. are conducted.

FIG. 17 shows an HfSiON film thickness dependency of a Vfb shift amount obtained by Y being inserted into the gate electrode. Here, the Vfb shift amount=ΔVfb is given by the following equation:

$$\Delta Vfb = (Vfb(\text{TaC}x/\text{Y}/\text{TaC}x/\text{HfSiON}/\text{Si})) - (Vfb(\text{TaC}x/\text{HfSiON}/\text{Si}))$$

In contrast to the above results of the MIS capacitor on which only the forming gas annealing at 450° C. is conducted, the Vfb shift obtained in a case where the HfSiON film is thin is not obtained in a case where the HfSiON film is thick. This indicates that the Vfb shift obtained in the case of the thin HfSiON film is not caused by a $\phi$eff change but by the fact that Y is present in the vicinity of an interface between the HfSiON film and an interfacial layer or on the side of the Si substrate from the interface, that is, in a region of 1 nm or less from an interface between the Si substrate and the gate insulating film in the gate insulating film structure. This effect is obtained owing to the diffusion of Y formed on the under-layer gate TaCx layer by a high-temperature heat treatment.

Figure 18:
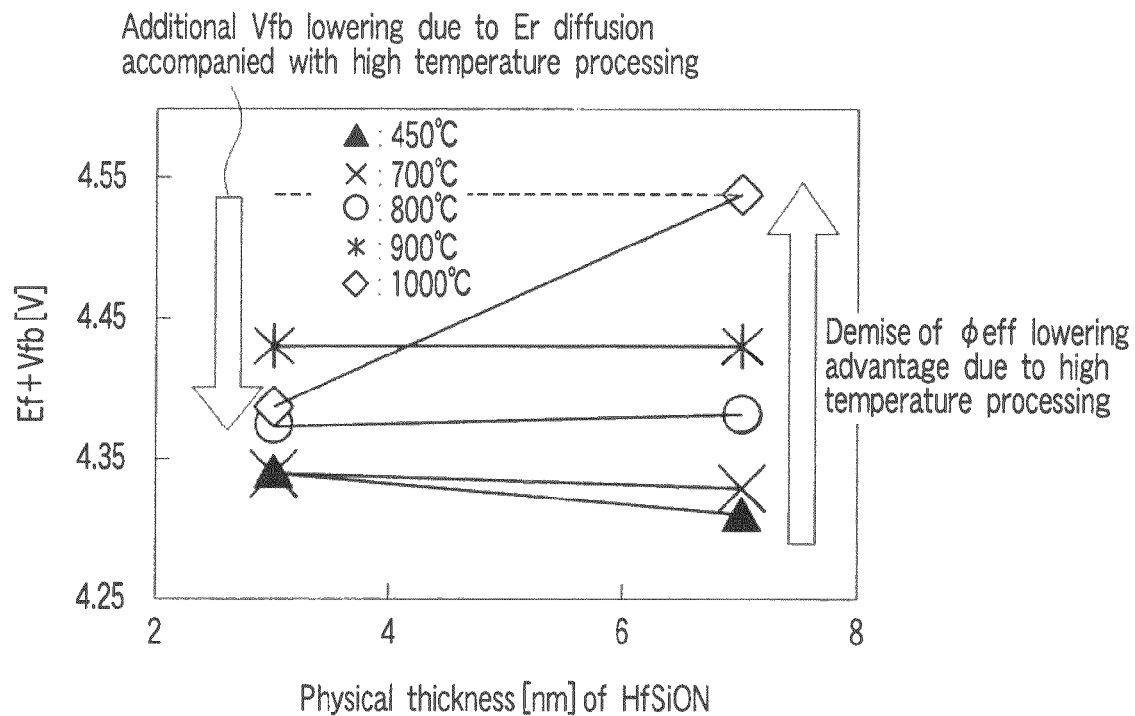
FIG. 18 is a graph showing an HfSiON film thickness dependency of (Vb+Ef) of MIS capacitors on which the annealing at 450° C. to 1000° C. is conducted after the formation of TaCx/Er/TaCx/HfSiON/Si structure.

FIG. 18 shows an HfSiON dependency of Vfb in a case where annealing at 450 to 1000° C. is conducted after the formation of a TaCx/Er/TaCx/HfSiON/Si structure. When a heat treatment temperature is in the range of 450 to 900° C., Vfb increases irrespective of the thickness of the HfSiON film, and this fact means that an $\phi$eff lowering effect due to the Y stack decreases. This is the reason why the above first embodiment must employ a replacement gate process, in which devices to be manufactured are not exposed to a high temperature environment.

On the other hand, after the annealing at 1000° C., Vfb decreases again only when the HfSiON film is thin. This indicates that, as described above, Vfb additionally decreases owing to the diffusion of Er in the vicinity of the interface between HfSiON and the interfacial layer or on the side of the Si substrate from the interface by the high temperature heat treatment.

As methods for obtaining this effect, there is a method which comprises forming a layer of Y on the under-layer TaCx, and then subjecting the formed layer to a heat treatment to diffuse Y as in the present embodiment, a method which comprises forming a layer of a rare earth element directly on the surface of a gate insulating film, and then diffusing the rare earth element therefrom, and a method which comprises forming a layer originally made of a rare earth element in a gate insulating film. However, a rare earth layer having a threshold voltage lowering effect of an n-channel type MISFET must not exist in a p-channel type MISFET, and hence there is required a step to peel off the rare earth layer on the p-channel type MISFET region. The peel-off step of the rare earth layer in the HfSiON structure or on the surface thereof has a risk of seriously affecting electrical characteristics, and this peel-off step involves a very high level of difficulty in a manufacturing process.

As compared with these methods, the peel off step of the rare earth layer on the under-layer metal gate has less influence on the electrical characteristics, and hence the level of difficulty of the process is not so high. Therefore, a device is most desirable in which the layer of the rare earth element is formed on the under-layer TaCx and the rare earth element is diffused from the layer into the insulating film structure. In accordance with this intention, the present embodiment consequently provides a structure shown in FIG. 15. Furthermore, to obtain the merit of this process, the under-layer gate electrode only needs to be present on the gate insulating film in the form of a successive film, and the thickness of the under-layer gate electrode only needs to be 1 monolayer or more.

The above embodiment has been described using TaCx as the material of the under-layer gate electrodes, but any other metals can be used to obtain a similar effect. However, to obtain the process merit of not subjecting the gate insulating film to the peel-off step, the under-layer gate electrodes are required to be resistant to the wet peel-off step. TaCx is one of the materials having the lowest solubility among the metals, and hence, from this viewpoint, TaCx is preferable as the material of the under-layer gate electrode.

Figure 19:
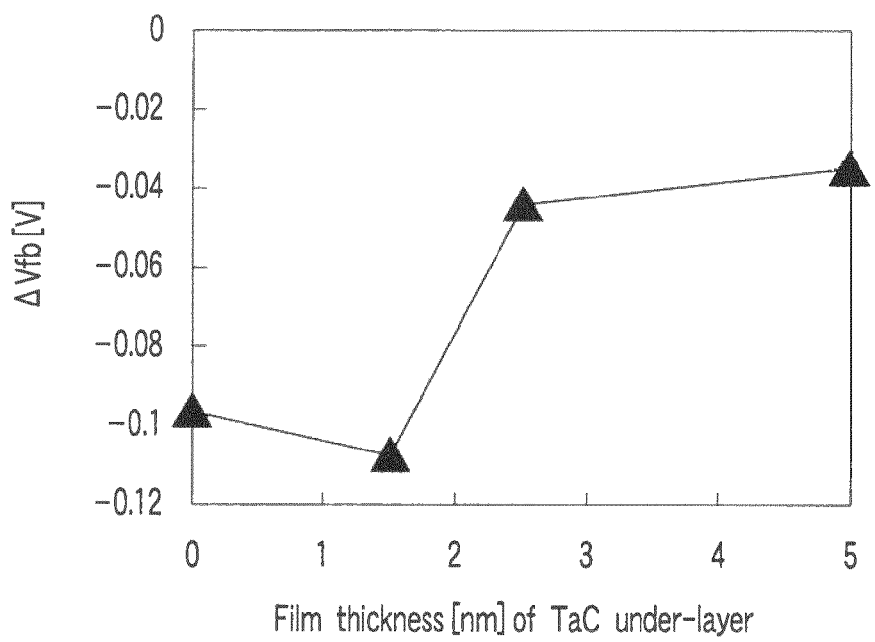
FIG. 19 is a graph showing an under-layer TaCx film thickness dependency of ΔVfb by Er stack in a case where the annealing at 1000° C. and then the forming gas annealing at 450° C. are conducted.

FIG. 19 is a graph obtained by plotting a Vfb change amount (Vfb(TaCx/Er/TaCx)−Vfb(TaCx)) due to Er stack to the thickness of a TaCx film formed as an under-layer gate electrode directly on HfSiON in a case where annealing at 1000° C. and then forming gas annealing at 450° C. are conducted after the formation of a TaCx/Er/TaCx/HfSiON/Si structure. When the film thickness of the TaCx under-layer becomes 1.5 nm or less, the Vfb change amount critically increases, and this fact indicates that when the film thickness of the TaCx under-layer is 1.5 nm or less, a sufficient quantity of a rare earth element is diffused in the vicinity of an interface between the HfSiON layer and an interfacial layer or on the side of the Si substrate from the interface. That is, as far as the layer containing the rare earth element is formed on a TaCx layer having a thickness of 1.5 nm or less, the effect of the present embodiment can be obtained.

The above embodiment has been described using the layer made of Y or Er as the layer formed on the TaCx layer, but the effect of the present embodiment is not limited to such a case. For the acquisition of the effect, it is a sufficient condition that a layer containing at least one of Sc, Y, lanthanoids, actinoids and alkaline earth metal elements is formed on the TaCx layer.

Figure 20:
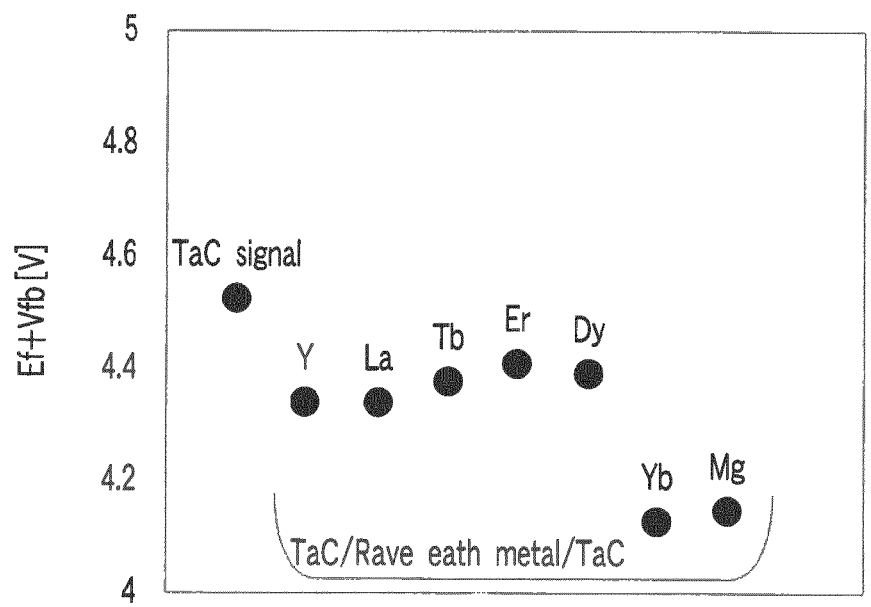
FIG. 20 is a graph of comparison between (Vfb+Ef) of an MIS capacitor on which the annealing at 1000° C. and then the forming gas annealing at 450° C. for 30 minutes are conducted after the formation of a TaCx/HfSiON/Si structure and a (Vfb+Ef) value of an MIS capacitor on which the annealing at 1000° C. and then the forming gas annealing at 450° C. for 30 minutes are conducted after the formation of a TaCx/rare earth metal or an alkaline earth metal-containing layer/TaCx/HfSiON/Si structure.

FIG. 20 shows Vfb obtained by use of an MIS capacitor on which annealing at 1000° C. and then forming gas annealing at 450° C. are conducted after the formation of a TaCx/HfSiON/Si structure and a TaCx/layer containing a rare earth metal or alkaline earth metal atom/TaCx/HfSiON/Si structure. Ef indicates the Fermi energy of a silicon substrate employed. It can be understood that a Vfb lowering effect is obtained even when a rare earth element other than Y and Er is stacked.

It is to be noted that Yb and Mg have a larger Vfb lowering effect than the other elements. This is considered to be because Yb and Mg are easily diffusive elements and the quantity of a rare earth element or an alkaline earth metal element having the Vfb lowering effect increases in the vicinity of an interface between HfSiON and an interfacial layer or on the side of the Si substrate from the interface.

In the present embodiment, a Vfb change effect of −250 mV or more is obtained, and hence when the under-layer gate electrode has a work function of 4.55 eV or less, it is possible to realize Vfb corresponding to a low $\phi$eff suitable for the n-channel type MISFET. In view of the relation between a composition and a work function of TaCx shown in FIG. 6, for the under-layer gate electrode to have a work function of 4.55 eV or less, a C atomic density of TaCx is suitably 65 atomic % or less.

Figure 21:
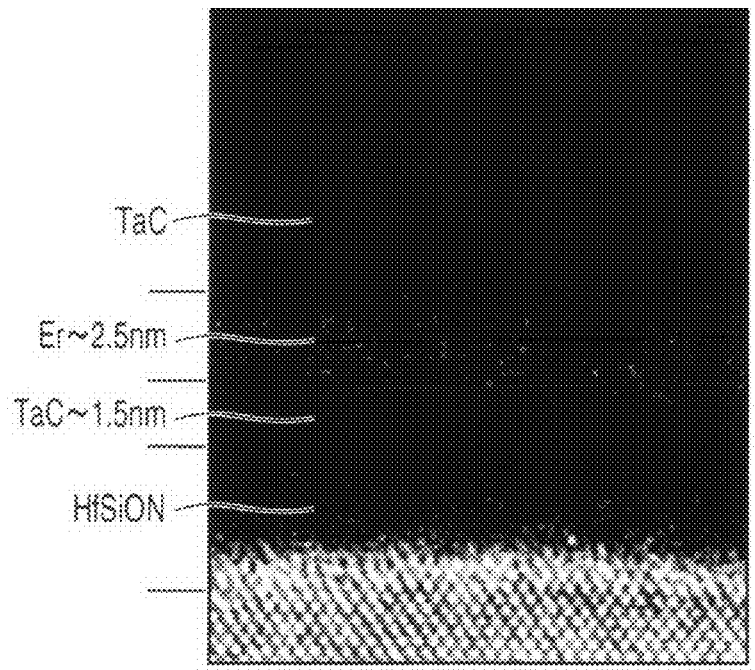
FIG. 21 is a cross-sectional TEM image of an MIS capacitor on which the annealing at 1000° C. and then the forming gas annealing at 450° C. for 30 minutes are conducted after the formation of a TaCx/Er/TaCx/HfSiON/Si structure.

FIG. 21 is a cross-sectional TEM image of a sample by which the effect of the present embodiment has actually been obtained and on which annealing at 1000° C. and then forming gas annealing at 450° C. are conducted after the formation of a TaCx/Er/TaCx/HfSiON structure.

Figure 22:
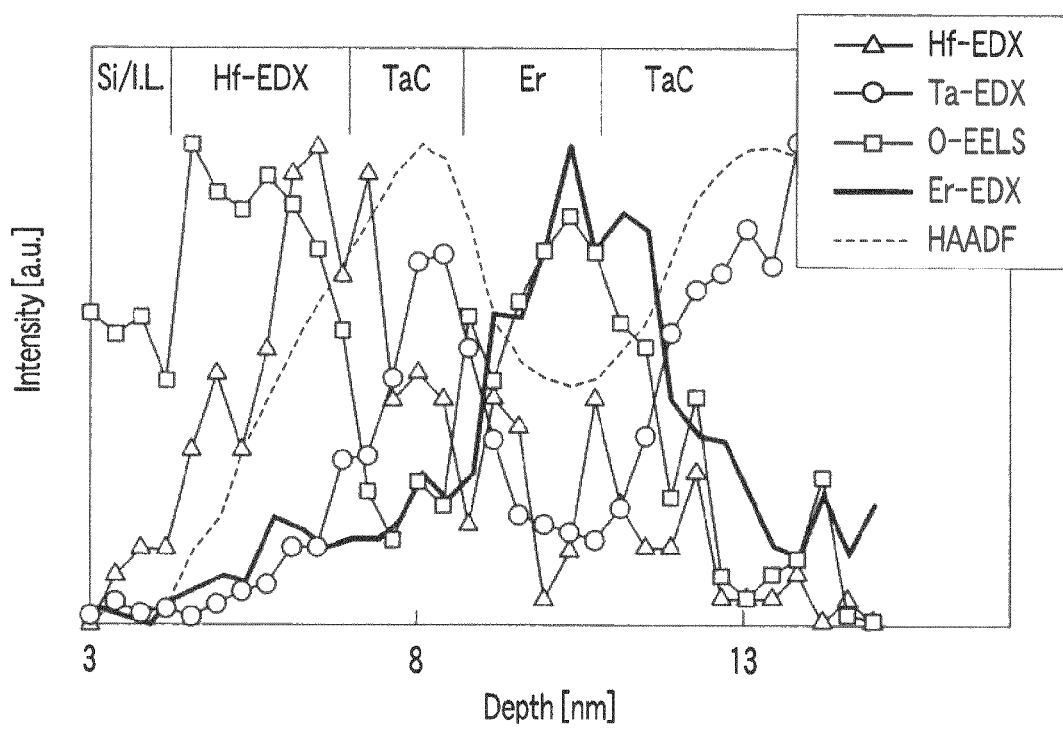
FIG. 22 is a graph showing a depth-directional distribution of each element found from EELS and EDX and an HAADF strength distribution o of an MIS capacitor on which the annealing at 1000° C. and then the forming gas annealing at 450° C. for 30 minutes are conducted after the formation of a TaCx/Er/TaCx/HfSiON/Si structure.

It has been confirmed based on data measured by EELS, EDX and HAADF shown in FIG. 22 that the elements mentioned in FIG. 21 are present at their respective positions. Furthermore, FIGS. 23 and 24 show profiles of rare earth elements found by back-side SIMS of a sample by which the Vfb lowering effect has actually been obtained and on which annealing at 1000° C. and then forming gas annealing at 450° C. are conducted after the formation of a TaCx/rare earth metal/TaCx/HfSiON structure, and in this case, the rare earth elements are Er and Yb.

Thus, it can be understood that Er and Yb are segregated in the vicinity of the interface between HfSiON and $SiO_2$ (interfacial layer). Furthermore, the strength of Er in the vicinity of the interface between HfSiON and $SiO_2$ is about 4.5% that of an Er layer on the TaCx layer, whereas the strength of Yb in the vicinity of the interface between HfSiON and $SiO_2$ is about 10% that of a Yb layer on the TaCx layer. This indicates that Yb is diffused more rapidly and hence it is present in a larger amount in the vicinity of the interface between HfSiON and $SiO_2$. This fact is considered to be one of reasons why Yb gives a particularly great Vfb lowering effect as described above. The rare earth element or the alkaline earth metal element in the gate stack structure can be detected by an analysis such as TEM-EELS, EDX or SIMS.

Figures 25, 26:
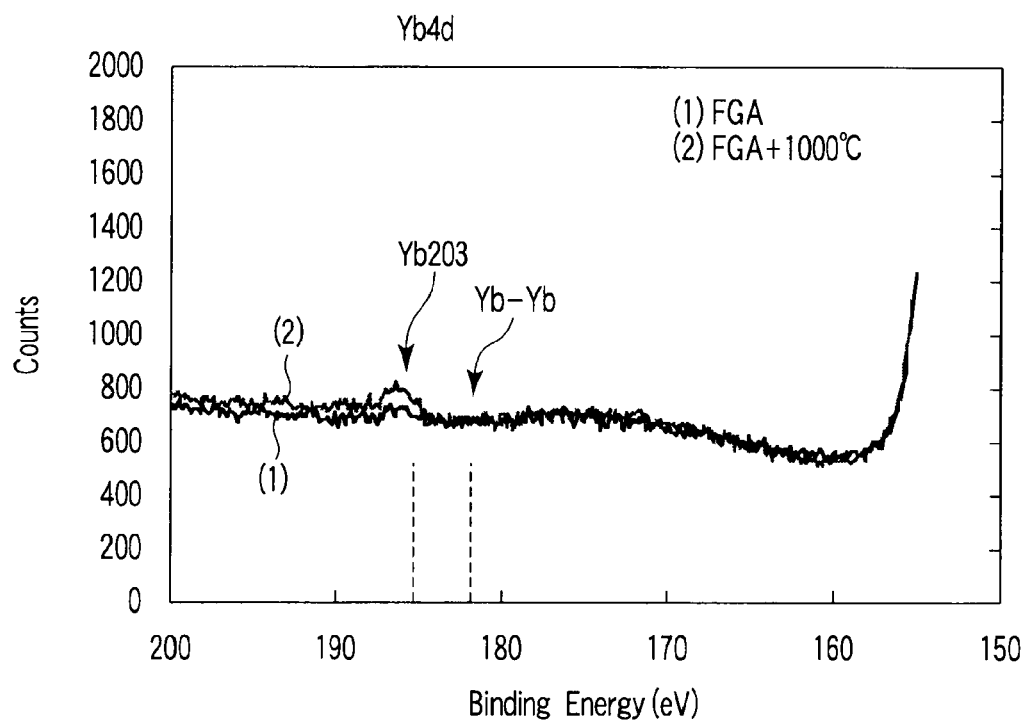
FIG. 25 shows Yb4d spectra obtained by back-side XPS analysis of an MIS capacitor on which the forming gas annealing at 450° C. for 30 minutes is conducted and an MIS capacitor on which the annealing at 1000° C. and then the forming gas annealing at 450° C. for 30 minutes are conducted after the formation of a TaCx/Yb/TaCx/HfSiON/Si structure.
FIG. 26 shows values obtained by converting, into a relative atom number by using a sensitivity coefficient of each element, a spectrum peak area of each element obtained by the back-side XPS analysis of an MIS capacitor on which the annealing at 1000° C. and then the forming gas annealing at 450° C. for 30 minutes are conducted after the formation of a TaCx/Yb/TaCx/HfSiON/Si structure.

FIG. 25 shows Yb4d spectra obtained by back-side XPS analysis of an MIS capacitor on which forming gas annealing (FGA) at 450° C. for 30 minutes is conducted and an MIS capacitor on which annealing at 1000° C. and then forming gas annealing at 450° C. for 30 minutes are conducted after the formation of a TaCx/Yb/TaCx/HfSiON/Si structure. Back-side XPS is X-ray photoemission spectroscopy (XPS) conducted through an $SiO_2$ layer, which is an interfacial layer of the interface between HfSiON and Si, after the removal of the Si substrate.

The spectra shown in FIG. 25 are obtained at a photoelectron take-off angle (TOA) of 15°. XPS measurement at a small take-off angle of TOA=15° is very sensitive to the surface of a sample (the side of the Si substrate in this case) and contains little information on the side of the gate electrode. The fact that a peak area of $Yb_2O_3$ increases in a case where the annealing at 1000° C. is conducted indicates that Yb is more diffused to the side of HfSiON by the annealing at 1000° C.

Furthermore, XPS spectra peak areas of Hf, Si, O, N, Ta and Yb were calculated in terms of relative atomic numbers by using sensitivity coefficients of the respective elements. As a result, the results shown in FIG. 26 were obtained. The proportion of the Yb atoms with respect to the metal atoms (Hf, Si and Yb) in the gate insulating film was about 0.4 atomic %. As described above, in the Yb stack layer sample, there was obtained a Vfb change of about 400 mV, which was larger than in cases of the other rare earth metal elements.

That is, to obtain a Vfb change of about 250 mV confirmed with the other rare earth elements, the rare earth element or the alkaline earth metal element present in the gate stack insulating film is required to occupy 0.25 atomic % or more of the metal elements in the gate insulating film.

Figure 29:
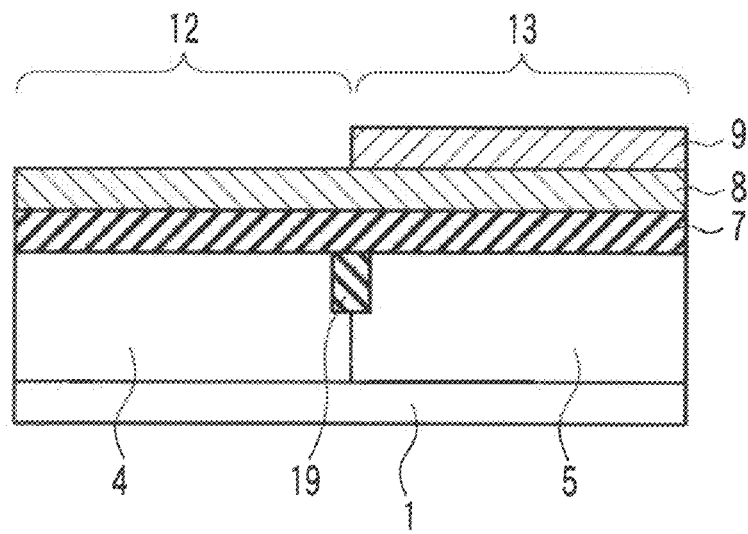

Next, description will be made about a method for manufacturing a semiconductor device of the present embodiment. The present manufacturing method uses a so-called gate first process (a process in which a gate is first formed) in the manufacture of transistors, and manufacturing steps are shown in FIGS. 27 to 29.

First, as shown in FIG. 27, the gate insulating film 7 is formed on the n-type semiconductor region 4 and the p-type semiconductor region 5 separated from each other by a device isolation layer 19 of an STI structure on the semiconductor substrate 1. Then, on the gate insulating film 7, the under-layer gate electrode 8 is formed as thick as 1 monolayer or more and 1.5 nm or less. In this case, the gate insulating film 7 is formed of HfSiON by an MOCVD method, and the under-layer gate electrode 8 is formed of $TaC_X$ by a sputtering process.

The reason why the thickness of the under-layer gate electrode 8 is regulated to 1.5 nm or less is that if the thickness of the under-layer gate electrode 8 is not 1.5 nm or less, the effect of the present embodiment cannot sufficiently be obtained after annealing at 1000° C. In other words, if the under-layer gate electrode 8 is too thick, the diffusion of elements such as Sc, Y, lanthanoids, actinoids and alkaline earth metal elements into the gate insulating film is blocked.

Next, as shown in FIG. 28, a mask material 18 of silicon oxide is formed on the under-layer gate electrode 8 on the n-type semiconductor region 4. Then, by using a film formation method such as a sputtering process or a CVD process, a layer 9 containing an element of alkaline earth metal elements, Sc, Y, lanthanoids and actinoids is formed on the under-layer gate electrode 8 and the mask material 18. Next, the layer 9 on the mask material 18 is peeled off together with the mask material 18 by using a liftoff method. Here, the layer 9 of Y is formed by the sputtering process. In such a manner, a structure shown in FIG. 29 is obtained.

Afterward, on the exposed under-layer gate electrode 8 on the n-type semiconductor region and on the layer 9, there is formed a gate electrode 10 which is made of a high-melting point metal such as TaCx, TiN or W, a polysilicon electrode or a stack structure thereof. Here, TaCx is deposited as the gate electrode 10 by the sputtering process. Then, the gate electrode and the gate insulating film are worked by lithography and etching such as RIE, followed by an ordinary semiconductor process to form diffusion layers 3 and 3', extension regions 2 and 2', a side wall layer 6 and an interlayer insulating film 11, whereby a structure shown in FIG. 15 is finally obtained. The reason why the gate insulating film and the under-layer gate electrode on the p-type semiconductor region 5 are indicated by 7' and 8' respectively in FIG. 15 is as follows. Metal atoms diffused from the layer 9 during a heating step after the formation of the gate stack are contained in the gate insulating film 7' and the under-layer gate electrode 8' on the p-type semiconductor region 5. As a result, a different naturally occurs between the gate insulating films 7 and 7' and a difference might occur between the under-layer gate electrodes 8 and 8'.

As described above, also according to the second embodiment, at least one of a simple substance, a nitride, a carbide and an oxide of an alkaline earth metal element or an element of the group III is provided on the under-layer gate electrode of the n-channel type MIS transistors, and hence a semiconductor device that includes n-channel type MIS transistors having a low threshold voltage can be realized by a manufacturing method of a lower level of process difficulty.

Second Modification

In the second embodiment, description has been made with reference to the case of using the high-concentration impurity diffused layer as the source/drain regions, but, needless to say, a so-called Schottky transistor using source/drain electrodes as the source/drain regions may be employed. The specific constitution of the source/drain electrodes is the same as in the first modification.

Here, a heating process of the source/drain electrodes is usually at 600° C. or less, and two operation methods are considered. The first method is a technology which employs the gate first process, but utilizes a work function change of the gate electrode described in the first embodiment to reduce a threshold voltage, and the second method is a technology in which a heat treatment is carried out after the formation of a third metal layer and before the formation of the source/drain electrodes, and the metal element diffused into a gate insulating film is utilized to lower a threshold voltage. In this case, a heat treatment temperature is preferably 1000° C. or more. As shown in FIG. 18, the acquisition of the effect is due to the temperature being 1000° C. It is to be noted that the upper limit of the temperature is suitably 1100° C. or less, which is a heat resistant temperature of the general gate insulating film and gate electrode.

Third Embodiment

As a threshold voltage lowering method of an p-channel type MISFET, there is known a technology of adding Al to a high-k gate insulating film (e.g., K. L. Lee et al., VLSI Tech. Symp. P. 202 (2006), H-S. Jung et al., VLSI Tech. Symp. p. 196 (2007), M. Kadoshima et al., VLSI Tech. Symp. p. 66 (2007), P. Sivasubramani et al., VLSI Tech. Symp. p. 68 (2007), K. Iwamoto et al., VLSI Tech. Symp. p. 70 (2007)), and the present invention can obtain the effect even when combined with any of these technologies. In the third embodiment, such examples will be described.

Figure 30:
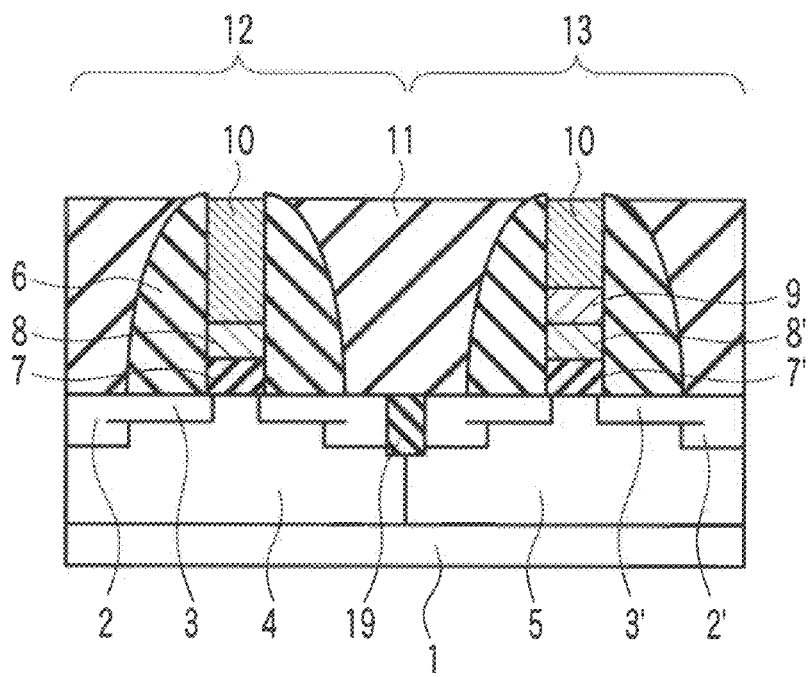
FIG. 30 is a cross-sectional view of a CMOS semiconductor device according to a third embodiment.

FIG. 30 is a cross-sectional view of a semiconductor device according to a third embodiment. The surface region of an Si substrate 1 as a semiconductor substrate is provided with an n-type semiconductor region 4 and a p-type semiconductor region 5, and on the respective regions, there are formed a p-channel type MISFET 12 and an n-channel type MISFET 13. The n-type and p-type semiconductor regions 4 and 5 are formed as so-called wells.

On the surface of the n-type semiconductor region 4, there is formed a film 7" containing Al on a part or all of the high-k gate insulating film of, for example, HfSiON, and on the surface of the p-type semiconductor region 5, there is formed a film 7''' in which Al is added to a part or all of the high-k gate insulating film of, for example, HfSiON.

The reason why the expressions of the gate insulating films 7" and 7''' are employed herein is that a difference inevitably occurs between the gate insulating film on the n-type semiconductor region and the gate insulating film on the p-type semiconductor region as a result in the subsequent steps. It is not intended to require steps for independently forming the gate insulating films on the n-type and p-type semiconductor regions, respectively.

On the gate insulating film 7" on the n-type semiconductor region 4, there is formed the under-layer gate electrode 8 of, for example, TaCx, and on the gate insulating film 7''' on the p-type semiconductor region 5, there is formed a gate electrode 8' containing, for example, TaCx as a main material. The reason why the expressions of the gate insulating films 8 and 8' are employed herein is that a difference may occurs between the under-layer gate electrode on the n-type semiconductor region 4 and the under-layer gate electrode on the p-type semiconductor region 5 as a result in the subsequent steps. It is not intended to require steps for independently forming the under-layer gate electrodes on the n-type and p-type semiconductor regions, respectively.

On the gate electrode 8' on the p-type semiconductor region 5, there is formed a gate electrode 9 containing at least one of a simple substance, a nitride, a carbide and an oxide of at least one metal element of alkaline earth metal elements and group III elements (Sc, Y, lanthanoids and actinoids). On the gate electrode 8 and the gate electrode 9, there is further formed a gate electrode 10 which is made of a high-melting point metal such as TaCx, TiN or W, a polysilicon electrode or a stack structure thereof.

FIGS. 31 and 32 schematically show comparison and a change state of Vfb values of CV characteristics of an MIS capacitor on which annealing at 1000° C. and then forming gas annealing at 450° C. are conducted after the formation of a TaCx/HfSiON/Al$_2$O$_3$/SiO$_2$/Si structure and a TaCx/Yb/TaCx/HfSiON/Al$_2$O$_3$/SiO$_2$/Si structure. Ef indicates the Fermi energy of a silicon substrate employed.

In a case where the gate electrode is made of TaCx/Yb/TaCx, CV characteristics of the gate electrode shift by about 600 mV in a negative direction as compared with a case where the gate electrode is made of a single layer of TaCx. A Vfb change amount due to the allocation of Al in the vicinity of an HfSiON/SiO$_2$ interface is 200 mV in a positive direction, and hence it can be understood that even in a case where a p-channel type MISFET threshold lowering technique is given, a Vfb change effect of about 400 mV in a negative direction due to Yb is maintained.

As methods for allocating Al in the vicinity of an HfSiON/SiO$_2$ interface, there is a technology of introducing Al$_2$O$_3$ into a high-k gate insulating film/SiO$_2$ interface, and a technology for forming an Al$_2$O$_3$ layer on the high-k gate insulating film, and then diffusing Al by a heating step. However, to inhibit the increase of the n-channel type MISFET threshold, the Al$_2$O$_3$ layer formed on a n-channel type MISFET region is required to be peeled off. However, when the present invention is used as the n-channel type MISFET threshold lowering technique, the n-channel type MISFET threshold can sufficiently be lowered even if this Al$_2$O$_3$ layer is not peeled off.

As described above, according to the third embodiment, even in a case where the method for adding Al into the high-k gate insulating film of both of n-type and p-type MISFET is used as the p-channel type MISFET threshold lowering technique, a CMOS semiconductor device having a low threshold voltage can be realized by providing a metal layer containing at least one of a simple substance, a nitride, a carbide and an oxide of at least one of alkaline earth metal elements and group III elements on the under-layer gate electrode of the n-channel type MIS transistors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an n-type semiconductor region and a p-type semiconductor region formed to be separated from each other on the semiconductor substrate;
   an interlayer insulating film formed on the semiconductor substrate and having a first trench and a second trench formed to reach the n-type semiconductor region and the p-type semiconductor region, respectively;
   a first gate insulating film formed along first side walls and a first bottom of the first trench;
   a second gate insulating film formed along second side walls and a second bottom of the second trench;
   a first metal layer formed along the first side walls and the first bottom of the first trench via the first gate insulating film;
   a second metal layer formed along the second side walls and the second bottom of the second trench via the second gate insulating film;
   a third metal layer formed on the second metal layer and containing at least one selected from the group consisting of a simple substance of a member, a nitride of the member, a carbide of the member and an oxide of the member, the member being at least one metal element selected from the group consisting of alkaline earth metal elements, Sc, Y, lanthanoids, and actinoids;
   first source/drain regions formed on the n-type semiconductor region to be opposed to each other with a portion of the first gate insulating film formed on the first bottom interposed therebetween; and
   second source/drain regions formed on the p-type semiconductor region to be opposed to each other with a portion of the second gate insulating film formed on the second bottom interposed therebetween.

2. The semiconductor device according to claim 1, wherein a work function of a material which remains after exclusion of the metal elements contained in the third metal layer from the elements constituting the second metal layer is 4.7 eV or less.

3. The semiconductor device according to claim 1, wherein the second metal layer has tantalum carbide and the metal element contained in the third metal layer.

4. The semiconductor device according to claim 3, wherein a C atom concentration of tantalum carbide is 85 atomic % or less.

5. A semiconductor device comprising:
   a semiconductor substrate;
   an n-type semiconductor region and a p-type semiconductor region formed to be separated from each other on the semiconductor substrate;
   a first gate insulating film formed on the n-type semiconductor region;
   a second gate insulating film formed on the p-type semiconductor region;
   a first metal layer formed on the first gate insulating film;
   a second metal layer formed on the second gate insulating film;
   a third metal layer formed on the second metal layer and contains at least one selected from the group consisting of a simple substance of a member, a nitride of the member, a carbide of the member and an oxide of the member, the member being at least one metal element selected from the group consisting of alkaline earth metal elements, Sc, Y, lanthanoids, and actinoids, and
   a first source/drain regions formed on the n-type semiconductor region to be opposed to each other with the first gate insulating film interposed therebetween; and a second source/drain region formed on the p-type semiconductor region to be opposed to each other with the second gate insulating film interposed therebetween.

6. The semiconductor device according to claim 5, wherein the first source/drain regions and the second source/drain regions are p-type and n-type high concentration impurity regions, respectively, or Schottky electrodes and the metal element is present in the second gate insulating film.

7. The semiconductor device according to claim 5, wherein the metal element is present in a region which is apart by at least 1.5 nm or less from the interface between the p-type semiconductor region and the second gate insulating film.

8. The semiconductor device according to claim 6, wherein the metal element present in the second gate insulating film occupies 0.25 atomic % or more of the second gate insulating film.

9. The semiconductor device according to claim 6, wherein a distribution of the metal element in the second gate insulating film has a maximal value.

10. The semiconductor device according to claim 5, wherein a work function of a material which remains after exclusion of the metal elements contained in the third metal layer from the elements constituting the second metal layer is 4.55 eV or less.

11. The semiconductor device according to claim 5, wherein the second metal layer includes tantalum carbide and the metal element contained in the third metal layer.

12. The semiconductor device according to claim 11, wherein a C atom concentration of tantalum carbide is 65 atomic % or less.

13. The semiconductor device according to claim 5, wherein the first gate insulating film contains Al.

14. The semiconductor device according to claim 1, wherein the second metal layer is formed as a continuous film of at least 1 monolayer and has a thickness of 1.5 nm or less.

15. The semiconductor device according to claim 5, wherein the second metal layer is formed as a continuous film of at least 1 monolayer and has a thickness of 1.5 nm or less.

* * * * *